United States Patent
Miyazawa et al.

(10) Patent No.: US 6,636,280 B1
(45) Date of Patent: Oct. 21, 2003

(54) LIQUID CRYSTAL DISPLAY DEVICE HAVING IMPROVED TFTS AND A FABRICATION METHOD THEREOF

(75) Inventors: Toshio Miyazawa, Chiba (JP); Akio Mimura, Mobara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/715,105

(22) Filed: Nov. 20, 2000

(30) Foreign Application Priority Data

Nov. 19, 1999 (JP) .......................................... 11-329725

(51) Int. Cl.⁷ .................. G02F 1/136; H01F 21/336
(52) U.S. Cl. .................. 349/43; 257/72; 438/30; 438/308
(58) Field of Search .................. 257/59, 72; 438/30, 438/486, 487, 488, 795, 308; 349/43, 151

(56) References Cited

U.S. PATENT DOCUMENTS

| | | |
|---|---|---|
| 5,864,150 A | 1/1999 | Lin |
| 5,894,151 A * | 4/1999 | Yamazaki et al. .......... 257/347 |
| 5,920,772 A | 7/1999 | Lin |
| 6,335,542 B2 * | 1/2002 | Miyasaka .................. 257/66 |

* cited by examiner

Primary Examiner—Kenneth Parker
(74) Attorney, Agent, or Firm—Antonelli, Terry, Stout & Kraus, LLP

(57) ABSTRACT

A liquid crystal display device is provided with a pixel area on a substrate having plural gate lines, plural drain lines, plural thin film transistors and plural pixel electrodes corresponding to the plural thin film transistors, and a drive circuit area disposed at a periphery of the substrate and having a drive circuit for driving the plural thin film transistors. The thin film transistor has a polycrystalline silicon semiconductor layer formed on the substrate, a gate electrode formed on the polycrystalline silicon semiconductor layer with a gate insulating film interposed therebetween, an insulating film to cover the polycrystalline silicon semiconductor layer, the gate insulating film and the gate electrode, a drain electrode formed on the insulating film and electrically connected to the polycrystalline silicon semiconductor layer, and a source electrode formed on the insulating film, spaced from the drain electrode and electrically connected to the polycrystalline silicon semiconductor layer. The unevenness of a surface of the polycrystalline silicon semiconductor layer is within 10% of a thickness of the polycrystalline silicon semiconductor layer.

22 Claims, 13 Drawing Sheets

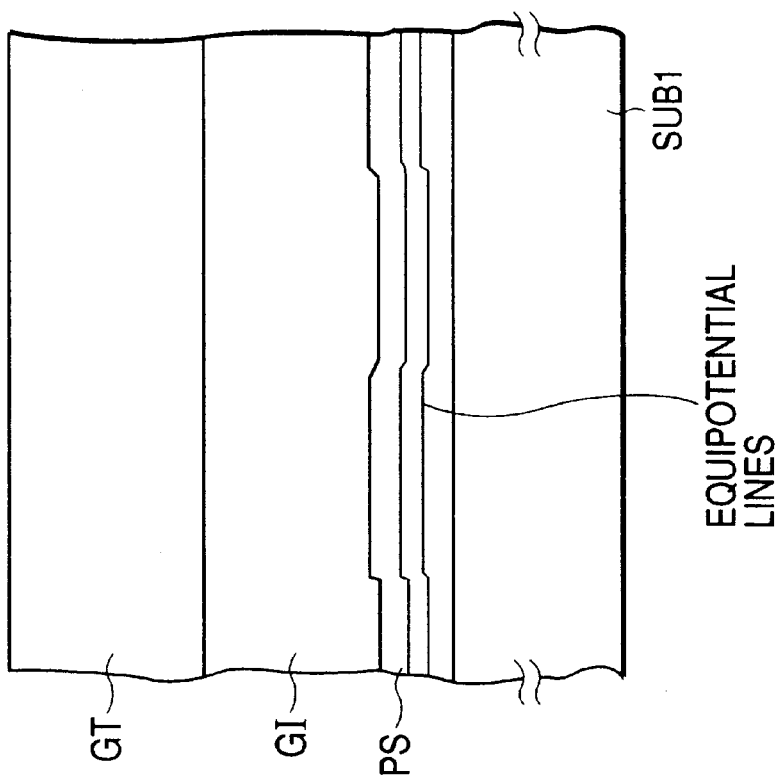
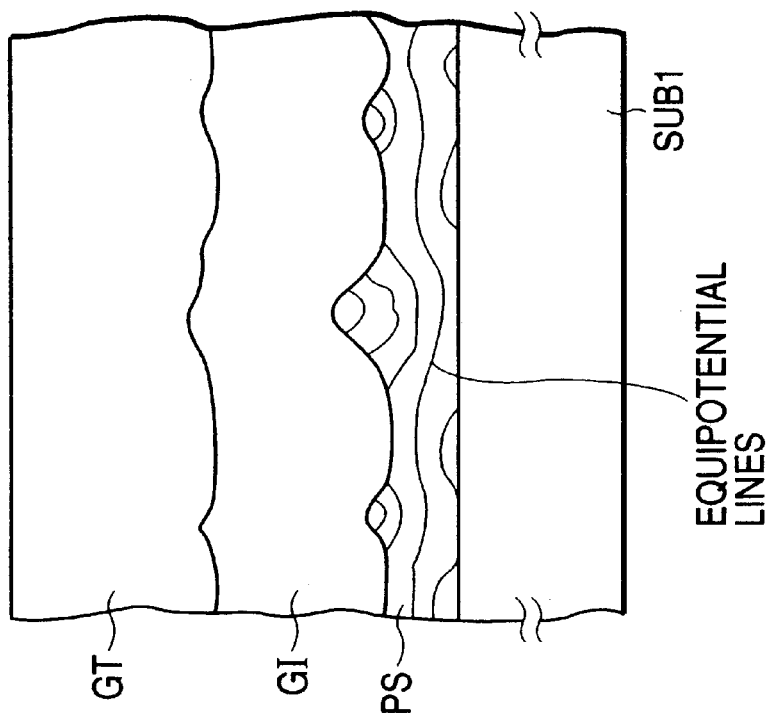

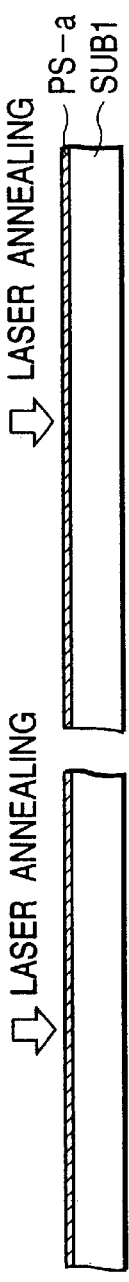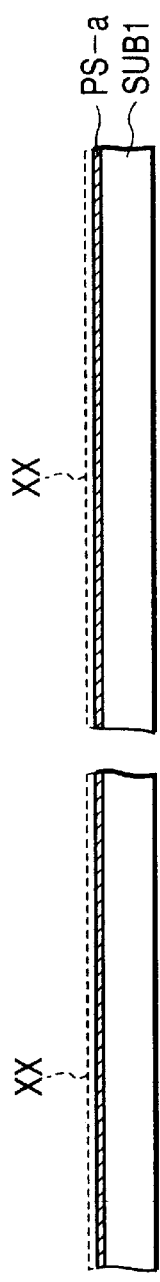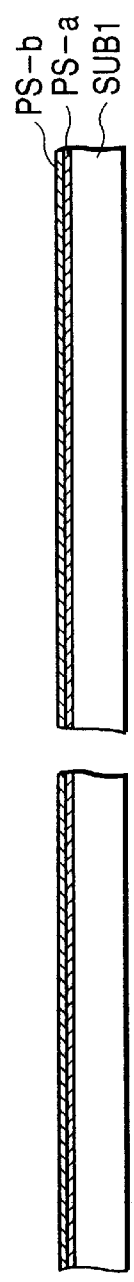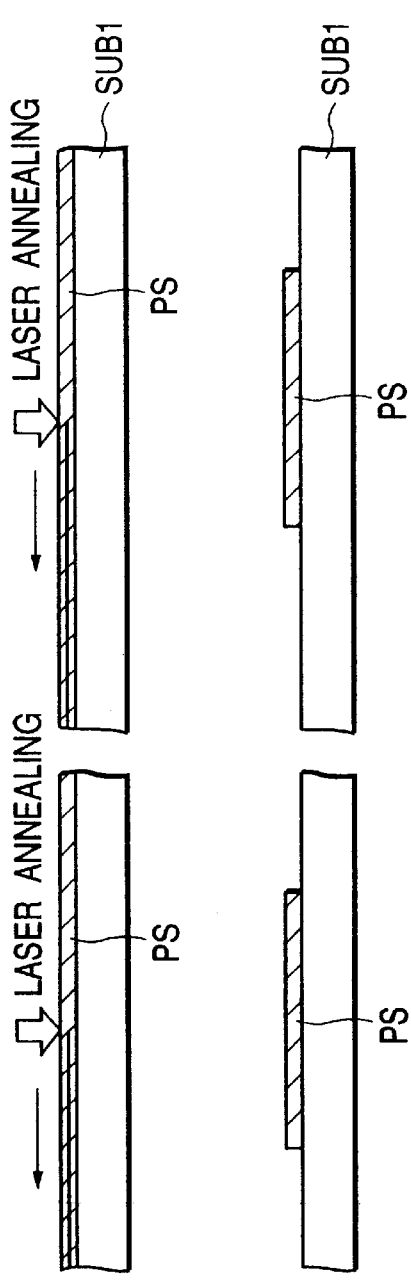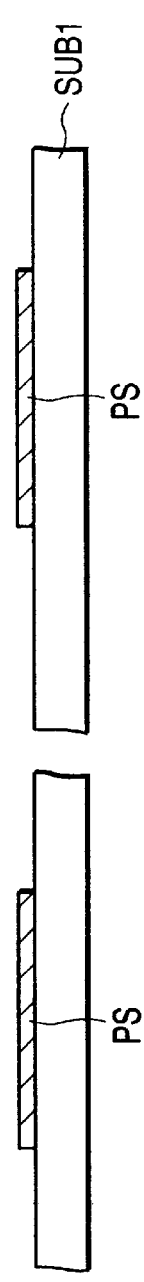
FIG. 7.1
FIG. 7.2
FIG. 7.3
FIG. 7.4
FIG. 7.5

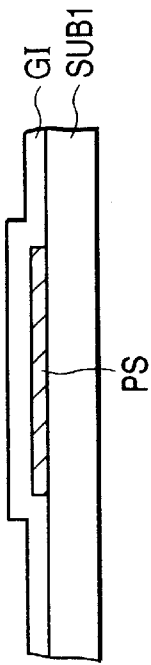
FIG. 7.6
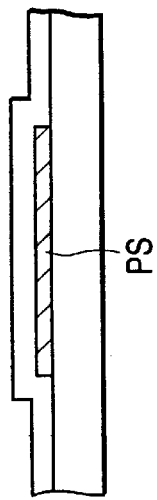
FIG. 7.7
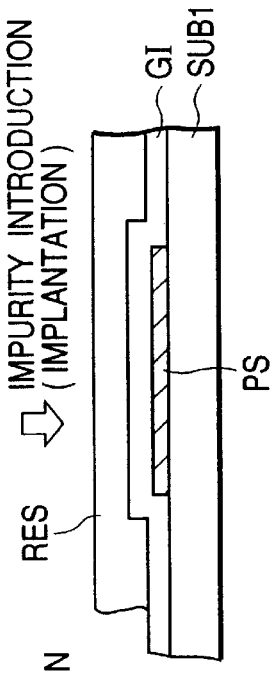
FIG. 7.8
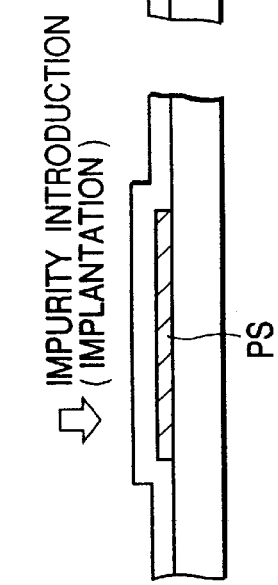
FIG. 7.9
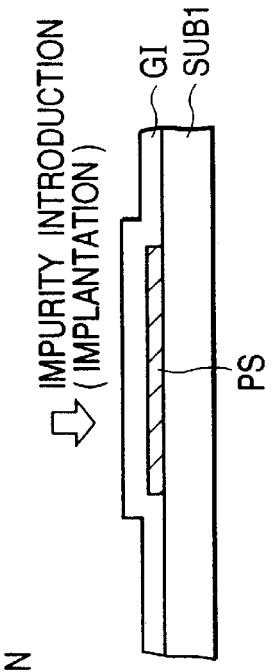
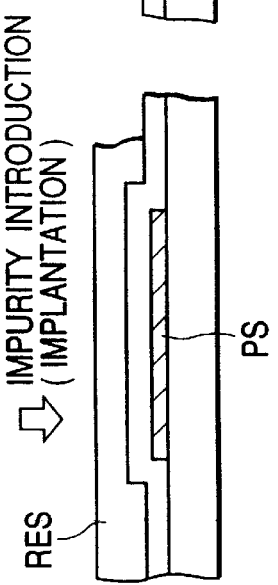
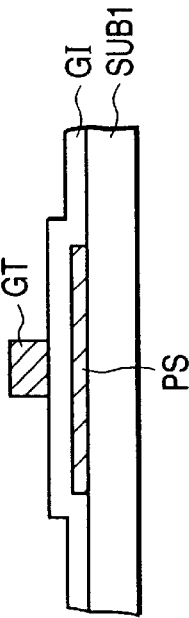
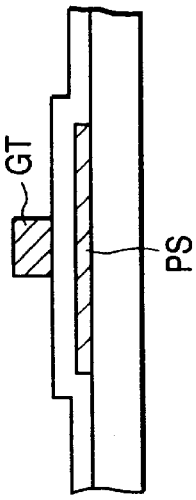

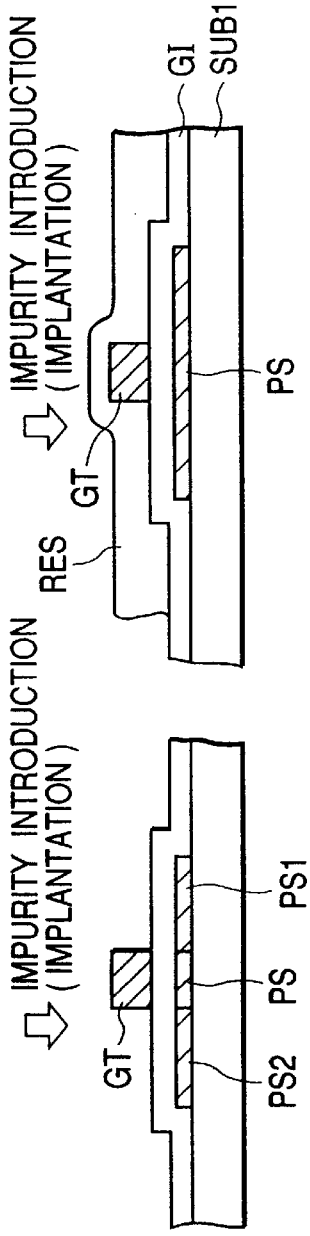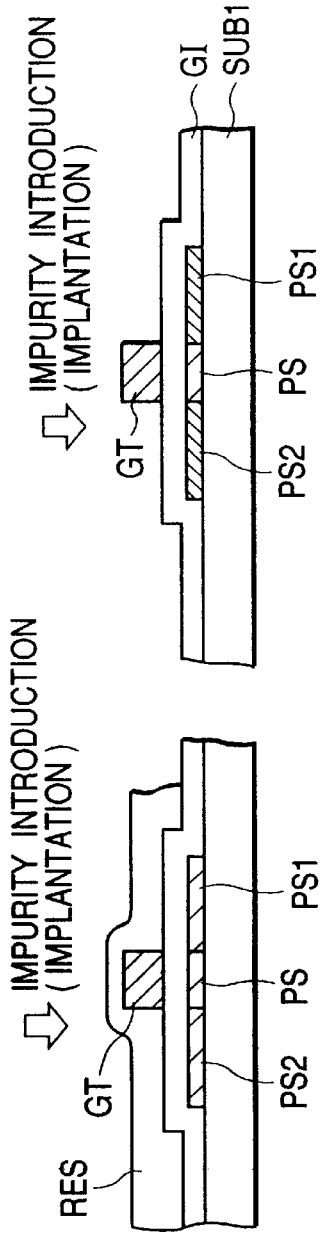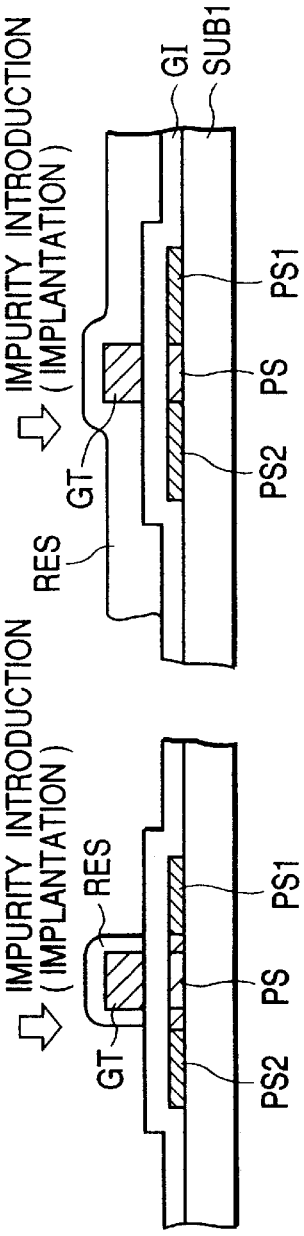
FIG. 7.10  FIG. 7.11  FIG. 7.12

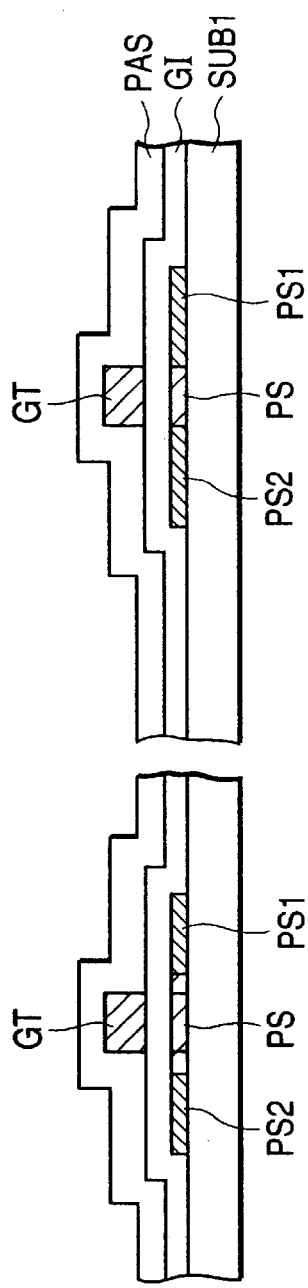
FIG. 7.13
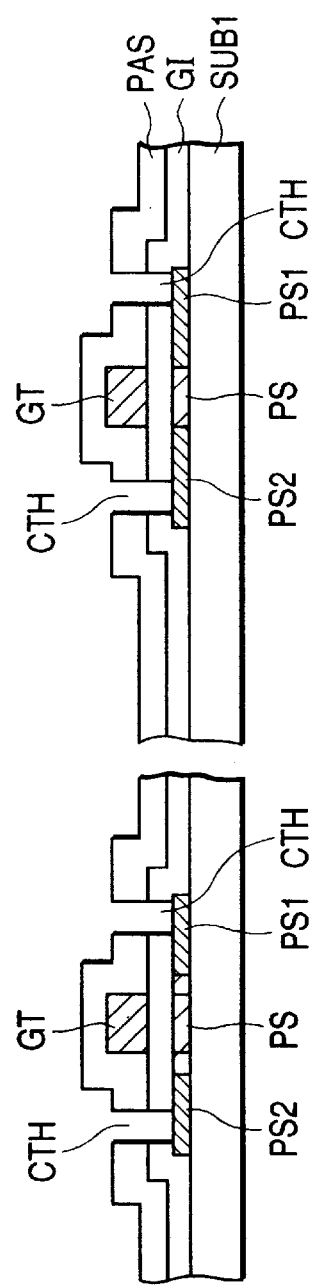
FIG. 7.14
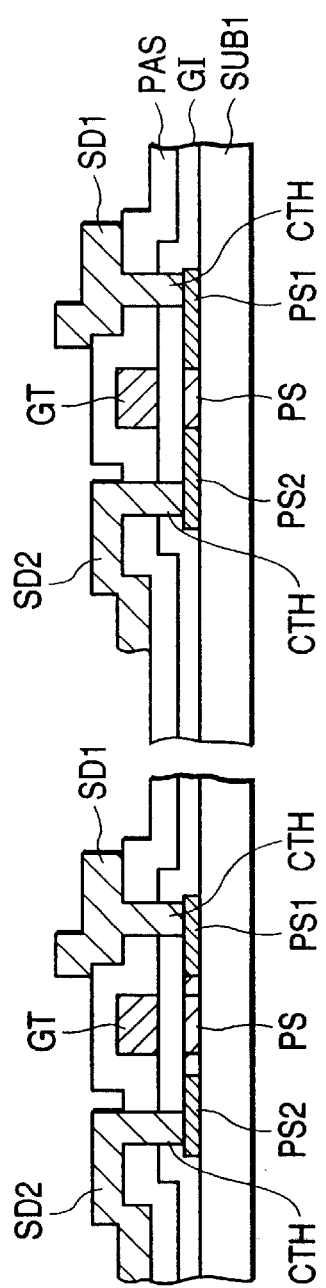
FIG. 7.15

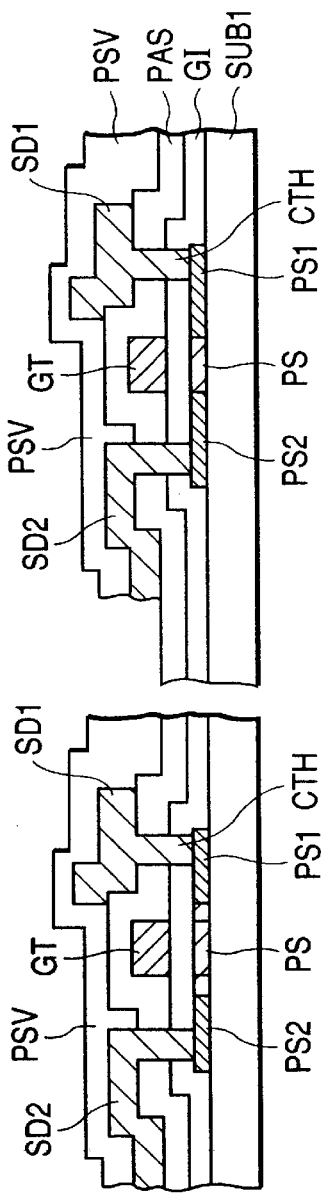
FIG. 7.16
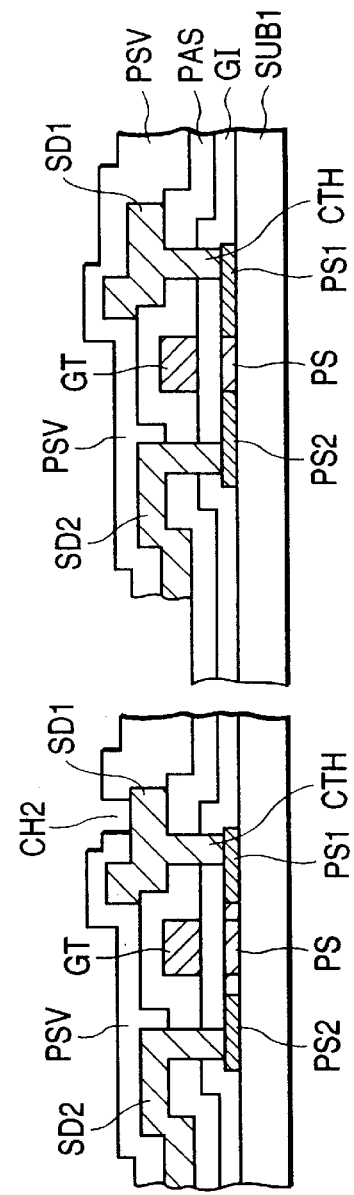
FIG. 7.17
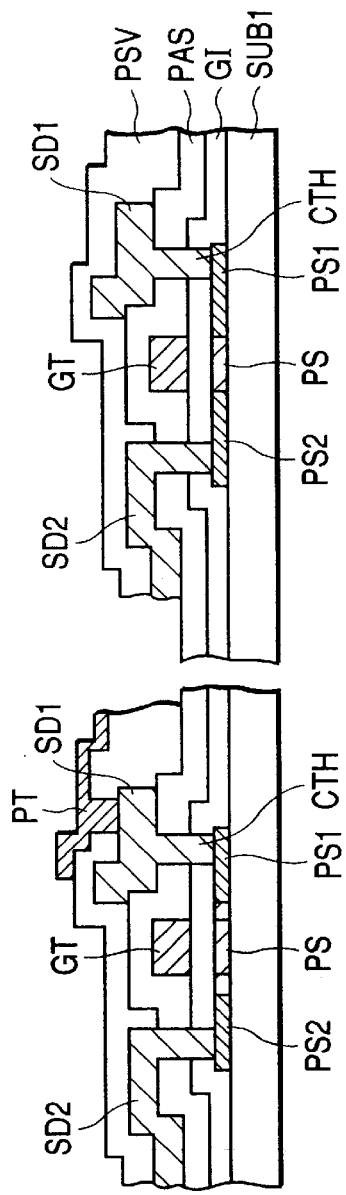
FIG. 7.18

LIQUID CRYSTAL DISPLAY DEVICE HAVING IMPROVED TFTS AND A FABRICATION METHOD THEREOF

BACKGROUND OF THE INVENTION

The present invention relates to a liquid crystal display device, and in particular to a low-voltage high-speed liquid crystal display device obtained by improving flatness of various thin films of an active matrix substrate fabricated using a polycrystalline silicon semiconductor formed by a laser annealing technique and a fabrication method thereof.

Liquid crystal display devices are widely used as display monitors in information processing terminals and video display devices of TV receivers. The liquid crystal display devices have a basic structure formed of a pair of insulating substrates and a liquid crystal layer contained therebetween, and display pictures or videos by changing orientations of liquid crystal molecules of the liquid crystal layer.

Various types of liquid crystal display devices are known which differ in a method of forming pixels. Among others, an active matrix type is widely adopted which disposes a switching element (an active element) at each pixel on an inner surface of one of a pair of insulating substrates and forms a display image by selecting some of the switching elements.

The most popular one of the active matrix type liquid crystal display devices is a thin film transistor (TFT) type liquid crystal display device which uses thin film transistors as the switching elements.

Recently, polycrystalline silicon semiconductor has been put to practical use as semiconductor layers constituting circuit elements such as thin film transistors and passive circuit components of the thin film transistor type liquid crystal display devices.

FIG. 8 is a schematic plan view of an active matrix substrate for explaining an example of a liquid crystal display device which uses polycrystalline silicon semiconductors. Reference character SUB1 denotes a first substrate (a lower substrate, an active matrix substrate), and scanning signal lines (gate lines) GL and video signal lines (drain lines) DL are arranged vertically and horizontally, respectively, in a display area AR. A thin film transistor TFT is disposed at each intersection of the scanning signal lines GL and the video signal lines DL, and a pixel electrode PT driven by one of the thin film transistors TFT forms a unit pixel.

Fabricated at the periphery of the display area AR on the substrate SUB1 are a vertical scanning drive circuit (a gate drive circuit) V for applying a scanning voltage to the gate lines GL, a horizontal scanning drive circuit (a drain drive circuit) H, and a precharge circuit PG.

Disposed at one side of the SUB1 is a terminal TM for receiving display signals from external equipment (a signal source such as a host computer or video signal processing equipment). Reference character COM denotes a terminal for applying a drive signal to a common electrode formed on the other insulating substrate (not shown).

To fabricate a polycrystalline silicon semiconductor film on an insulating substrate made of glass or quartz (hereinafter referred to merely as a substrate), a method has been generally used which forms an amorphous silicon film on the substrate using a technique such as CVD, then irradiates a laser beam onto the amorphous silicon film to melt locally the amorphous silicon film only and convert it into a polycrystalline silicon film at a temperature at which a low heat-resistance substrate such as a glass substrate is not melted or broken.

This method makes it possible to use relatively inexpensive glass as substrates, and thereby to reduce the cost of liquid crystal display devices and place high-quality liquid crystal display devices on the market.

The method is disclosed in Japanese Patent Application Laid-open No. Hei 10-41234 (laid-open on Feb. 13, 1998), for example, which forms an amorphous silicon film on a substrate using a technique such as CVD, then irradiates a laser beam onto the amorphous silicon film to form a polycrystalline silicon semiconductor film on a low heat-resistance substrate such as a glass substrate The prior art disclosed by Japanese Patent Application Laid-open No. Hei 10-41234 forms a polycrystalline silicon film by irradiating a laser beam onto a single-layer amorphous silicon film only, but it does not teach a method which forms the second layer made of an amorphous silicon on the first layer made of a polycrystalline silicon film, and then grows crystals from the second layer made of the amorphous silicon film with the first layer made of the polycrystalline silicon film used as nucleuses by irradiating the laser beam onto the second layer of the amorphous silicon film.

Japanese Patent Application Laid-open No. Hei 11-40501 (laid-open Feb. 12, 1999) discloses a prior art which first forms a polycrystalline silicon film by irradiating a laser beam onto the first layer made of an amorphous silicon film, then forms the second layer made of an amorphous silicon film on the first layer made of the polycrystalline silicon film, and then convert the second layer made of the amorphous silicon film into a polycrystalline silicon film by irradiating a laser beam onto the second layer of the amorphous silicon film.

But, in the technique of Japanese Patent Application Laid-open No. Hei 10-41234, there was not a concept of removing impurities from the first layer made of the polycrystalline silicon film, therefore regions having large concentrations of impurities are present at an interface between the first and second layers made of the polycrystalline silicon films and the impurities hinder the polycrystalline silicon films of the first and second layers from melting together, and consequently, this made it difficult to obtain an integral polycrystalline silicon film having good crystal quality and free from boundaries between the first and second layers made of the polycrystalline silicon films.

The above-mentioned impurities are intended to mean the composition of air, dust particles floating in air, but not impurities intentionally introduced into the polycrystalline silicon film to determine the conductivity type of the polycrystalline silicon film, such as boron, phosphorus or arsenic.

Japanese Patent Application Laid-open No. Hei 7-99321 (laid-open on Apr. 11, 1995) discloses a technique which first forms the first layer made of a polycrystalline silicon film, then stack the second layer made of an amorphous silicon film on the first layer of the polycrystalline silicon film without exposing the polycrystalline film to the atmosphere, and then convert the second layer of the amorphous silicon film into a polycrystalline silicon film by irradiating a laser beam onto the amorphous silicon film.

But, in the technique of Japanese Patent Application Laid-open No. Hei 7-99321, there was not a concept of planarizing a surface of a polycrystalline silicon film, and therefore the technique did not include a cleaning process for removing protrusions produced in the first layer of the polycrystalline silicon film by irradiation of the laser beam before stacking the second layer of the amorphous silicon film on the first layer of the polycrystalline silicon film. Consequently, in the technique of Japanese Patent Application Laid-open No. Hei 7-99321, it was difficult to obtain a polycrystalline silicon film having a very flat surface, unlike the present invention.

SUMMARY OF THE INVENTION

In a polycrystalline silicon film fabricated by the above-mentioned prior art technique, large protrusions are produced between crystals when an amorphous silicon film is crystallized. Generally, the thickness of a polycrystalline silicon film is selected to be between 20 nm and 100 nm, the above-mentioned protrusions sometimes measure 50% to 200% of the formed film thickness, and consequently, the polycrystalline silicon film has a large number of protrusions rising above its surface.

FIG. 9 is a sketch reproduced from a micrograph of a structural cross section of stacked films at an essential part of a thin film transistor fabricated on an active matrix substrate constituting a prior art liquid crystal display device. The thin film transistor is of the MOS field-effect type.

In FIG. 9, reference character SUB1 denotes a substrate, PS is a polycrystalline silicon semiconductor layer, GI is a gate insulating layer, GT is a gate electrode, PAS is an interlayer insulator. As shown in FIG. 9, the polycrystalline silicon semiconductor layer PS has a large number of protrusions rising above its surface, and as a result, the cross sections of the gate insulating layer GI and the gate electrode GT stacked on the semiconductor layer PS conform generally to the surface conditions of the polycrystalline silicon semiconductor layer PS.

In the thin film transistor using as its semiconductor layer the polycrystalline silicon semiconductor film fabricated by the above-mentioned prior art technique, the following limitations are imposed on device structures and transistor operation, and as a result, transistor characteristics are deteriorated and consequently, display characteristics are degraded.

(1) To ensure an insulation between the polycrystalline silicon semiconductor layer and the gate electrode serving as an electric-field controlling layer, and a desired dielectric breakdown strength therebetween, it is necessary to make the gate insulator GI thick enough to cover the above-explained protrusions sufficiently. As a result, it is not possible to reduce the thickness of the gate insulator GI, and its thickness is usually selected to be about 100 nm.

(2) After the insulating film is fabricated as explained in (1), an impurity is sometimes introduced into the insulating film by a technique such as ion implantation to control a threshold voltage of the thin film transistor. The lateral distributions of impurity concentrations (e.g., a contour of an equal-impurity concentration approximated by a curve formed by connecting positions of peaks of the depth distributions of impurity concentrations) depends upon the shapes of the protrusions and the insulating film formed to cover the protrusions, and for example, the lateral distributions of impurity concentrations become uneven with respect to a horizontal plane (a surface of the substrate) when the insulating layer conforms very well to the underlying polycrystalline silicon semiconductor layer.

It is possible to form the insulating layer so as to absorb unevenness of the underlying polycrystalline silicon semiconductor layer and provide an even surface, but, in this case, the insulating layer often becomes thicker due to the conditions required in (1) above, and the thickness of the insulating layer varies greatly from position to position (not less than 20%) such that the variations produce a disadvantage of modulating locally the field effect by the gate electrode serving as an electric-field control electrode.

(3) Generally source and regions are formed by first forming the insulating layer as explained in (1) above, next coating an electrode material on the insulating layer and patterning the electrode material film into the gate electrode and then introducing impurities into the polycrystalline silicon film by a technique such as ion implantation. In this case also, a contour of an equal-impurity concentration becomes uneven and protrudent with respect to a surface of the substrate like the case of (2) above.

If the size of the protrusions is equal to or more than 50% of the thickness of the polycrystalline silicon semiconductor layer, local variations in impurity concentration occur along the current-flowing direction in the source or drain region and this makes it difficult to control a resistance in the source or drain region.

It is objects of the present invention to provide a liquid crystal display device having an active matrix substrate including stable low-voltage high-speed thin film transistors by solving the above-explained problems with the prior art and thereby reducing unevenness of the polycrystalline silicon semiconductor layer, making the insulating layer thinner and flattening the lateral distributions of impurity concentrations, and to provide a method of fabricating the liquid crystal display device.

The following are some representative configurations of liquid crystal display devices of the present invention for achieving the above objects:

In accordance with an embodiment of the present invention, there is provided a liquid crystal display device provided with a pixel area on a substrate having a plurality of gate lines, a plurality of drain lines, a plurality of thin film transistors, and a plurality of pixel electrodes corresponding to the plurality of thin film transistors, and a drive circuit area disposed at a periphery of the substrate and having a drive circuit for driving the plurality of thin film transistors, the plurality of thin film transistors comprising: a polycrystalline silicon semiconductor layer formed on the substrate, a gate electrode formed on the polycrystalline silicon semiconductor layer with a gate insulating film interposed therebetween, an insulating film to cover the polycrystalline silicon semiconductor layer, the gate insulating film and the gate electrode, a drain electrode formed on the insulating film and electrically connected to the polycrystalline silicon semiconductor layer, a source electrode formed on the insulating film, spaced from the drain electrode and electrically connected to the polycrystalline silicon semiconductor layer, unevenness of a surface of the polycrystalline silicon semiconductor layer being within 10% of a thickness of the polycrystalline silicon semiconductor layer, and variations of positions of peaks of depth distributions of concentration of impurities introduced into the polycrystalline silicon semiconductor layer to determine a conductivity type thereof being within 10% of the thickness of the polycrystalline silicon semiconductor layer, the positions of the peaks being measured from a surface of the substrate.

In accordance with another embodiment of the present invention, there is provided a liquid crystal display device provided with a pixel area on a substrate having a plurality of gate lines, a plurality of drain lines, a plurality of thin film transistors, and a plurality of pixel electrodes corresponding to the plurality of thin film transistors, and a drive circuit area disposed at a periphery of the substrate and having a drive circuit for driving the plurality of thin film transistors, the plurality of thin film transistors comprising: a polycrystalline silicon semiconductor layer formed on the substrate, a gate electrode formed on the polycrystalline silicon semiconductor layer with a gate insulating film interposed therebetween, an insulating film to cover the polycrystalline silicon semiconductor layer, the gate insulating film and the gate electrode, a drain electrode formed on the insulating film and electrically connected to the polycrystalline silicon semiconductor layer, and a source electrode formed on the insulating film, spaced from the drain electrode and electrically connected to the polycrystalline silicon semiconductor layer, unevenness of a surface of the polycrystalline silicon semiconductor layer being within 10% of a thickness of the polycrystalline silicon semiconductor layer.

In accordance with another embodiment of the present invention, there is provided a liquid crystal display device provided with a pixel area on a substrate having a plurality of gate lines, a plurality of drain lines, a plurality of thin film transistors and a plurality of pixel electrodes corresponding to the plurality of thin film transistors, and a drive circuit area disposed at a periphery of the substrate and having a drive circuit for driving the plurality of thin film transistors, the plurality of thin film transistors comprising: a polycrystalline silicon semiconductor layer formed on the substrate, a gate electrode formed on the polycrystalline silicon semiconductor layer with a gate insulating film interposed therebetween, an insulating film to cover the polycrystalline silicon semiconductor layer, the gate insulating film and the gate electrode, a drain electrode formed on the insulating film and electrically connected to the polycrystalline silicon semiconductor layer, and a source electrode formed on the insulating film, spaced from the drain electrode and electrically connected to the polycrystalline silicon semiconductor layer, variations of positions of peaks of depth distributions of concentration of impurities introduced into the polycrystalline silicon semiconductor layer to determine a conductivity type thereof being within 10% of the thickness of the polycrystalline silicon semiconductor layer, the positions of the peaks being measured from a surface of the substrate.

In accordance with another embodiment of the present invention, there is provided a liquid crystal display device comprising a first substrate having a pixel electrode thereon and a thin film transistor coupled to the pixel electrode, a second substrate having a common electrode disposed thereon to face the pixel electrode, and a liquid crystal layer sealed between the first and second substrates, the thin film transistor comprising: a polycrystalline silicon semiconductor layer formed on the first substrate, a gate electrode formed on the polycrystalline silicon semiconductor layer with a gate insulating film interposed therebetween, an insulating film formed to cover the polycrystalline silicon semiconductor layer, the gate insulating film and the gate electrode, a drain electrode formed on the insulating film and electrically connected to the polycrystalline silicon semiconductor layer, and a source electrode formed on the insulating film, spaced from the drain electrode and electrically connected to the polycrystalline silicon semiconductor layer, the polycrystalline silicon semiconductor layer being composed of a first polycrystalline silicon semiconductor film and a second polycrystalline silicon semiconductor film, the first polycrystalline silicon semiconductor film being formed on the first substrate by laser annealing, having a thickness equal to or less than 50 nm, and having unevenness of a surface thereof within 10% of a thickness of the polycrystalline silicon semiconductor layer, the second polycrystalline silicon semiconductor film being formed by depositing and then laser annealing an amorphous silicon semiconductor film of 50 nm or less in thickness on the first polycrystalline silicon semiconductor film, and a concentration of oxygen at an interface and its vicinities between the first and second polycrystalline silicon semiconductor films being equal to or less than $10^{19}$ atoms/cm$^3$.

In accordance with another embodiment of the present invention, there is provided a liquid crystal display device comprising a first substrate having a pixel electrode thereon and a thin film transistor coupled to the pixel electrode, a second substrate having a common electrode disposed thereon to face the pixel electrode, and a liquid crystal layer sealed between the first and second substrates, the thin film transistor comprising: a polycrystalline silicon semiconductor layer formed on the first substrate, a gate electrode formed on the polycrystalline silicon semiconductor layer with a gate insulating film interposed therebetween, an insulating film formed to cover the polycrystalline silicon semiconductor layer, the gate insulating film and the gate electrode, a drain electrode formed on the insulating film and electrically connected to the polycrystalline silicon semiconductor layer, and a source electrode formed on the insulating film, spaced from the drain electrode and electrically connected to the polycrystalline silicon semiconductor layer, the polycrystalline silicon semiconductor layer being composed of a first polycrystalline silicon semiconductor film and a second polycrystalline silicon semiconductor film, the first polycrystalline silicon semiconductor film being formed on the first substrate by laser annealing, having a thickness equal to or less than 50 nm, and having unevenness of a surface thereof within 10% of a thickness of the polycrystalline silicon semiconductor layer, the second polycrystalline silicon semiconductor film being formed by depositing and then laser annealing an amorphous silicon semiconductor film of 50 nm or less in thickness on the first polycrystalline silicon semiconductor film, and peaks of depth distribution of concentration of oxygen are not at an interface or its vicinities between the first and second polycrystalline silicon semiconductor films.

In accordance with another embodiment of the present invention, there is provided a liquid crystal display device provided with a pixel area on a substrate having a plurality of gate lines, a plurality of drain lines, a plurality of thin film transistors, and a plurality of pixel electrodes corresponding to the plurality of thin film transistors, and a drive circuit area disposed at a periphery of the substrate and having a drive circuit for driving the plurality of thin film transistors, the thin film transistors comprising: a polycrystalline silicon semiconductor layer formed on the substrate, a gate electrode formed on the polycrystalline silicon semiconductor layer with a gate insulating film interposed therebetween, an insulating film formed to cover the polycrystalline silicon semiconductor layer, the gate insulating film and the gate electrode, a drain electrode formed on the insulating film and electrically connected to the polycrystalline silicon semiconductor layer, and a source electrode formed on the insulating film, spaced from the drain electrode and electrically connected to the polycrystalline silicon semiconductor layer, the polycrystalline silicon semiconductor layer being composed of a first polycrystalline silicon semiconductor film and a second polycrystalline silicon semiconductor film, the first polycrystalline silicon semiconductor film being formed on the substrate by laser annealing, having a thickness equal to or less than 50 nm, and having unevenness of a surface thereof within 10% of a thickness of the polycrystalline silicon semiconductor layer, the second polycrystalline silicon semiconductor film being formed on the first polycrystalline silicon semiconductor film by depositing and then laser annealing an amorphous silicon semiconductor film of 50 nm or less in thickness on the first polycrystalline silicon semiconductor film, and a concentration of nitrogen at an interface and its vicinities between the first and second polycrystalline silicon semiconductor films being equal to or less than $10^{19}$ atoms/cm$^3$.

In accordance with another embodiment of the present invention, there is provided a liquid crystal display device provided with a pixel area on a substrate having a plurality of gate lines, a plurality of drain lines, a plurality of thin film transistors, and a plurality of pixel electrodes corresponding to the plurality of thin film transistors, and a drive circuit area disposed at a periphery of the substrate and having a drive circuit for driving the plurality of thin film transistors, the thin film transistors comprising: a polycrystalline silicon semiconductor layer formed on the substrate, a gate electrode formed on the polycrystalline silicon semiconductor layer with a gate insulating film interposed therebetween, an insulating film formed to cover the polycrystalline silicon semiconductor layer, the gate insulating film and the gate electrode, a drain electrode formed on the insulating film and electrically connected to the polycrystalline silicon semiconductor layer, and a source electrode formed on the insulating film, spaced from the drain electrode and electrically connected to the polycrystalline silicon semiconductor layer, the polycrystalline silicon semiconductor layer being composed of a first polycrystalline silicon semiconductor film and a second polycrystalline silicon semiconductor film, the first polycrystalline silicon semiconductor film being formed on the substrate by laser annealing, having a thickness equal to or less than 50 nm, and having unevenness of a surface thereof within 10% of a thickness of the polycrystalline silicon semiconductor layer, the second polycrystalline silicon semiconductor film being formed on the first polycrystalline silicon semiconductor film by depositing and then laser annealing an amorphous silicon semiconductor film of 50 nm or less in thickness on the first polycrystalline silicon semiconductor film, and peaks of depth distribution of concentration of nitrogen are not at an interface or its vicinities between the first and second polycrystalline silicon semiconductor films.

The above configurations provide liquid crystal display devices having an active matrix substrate including stable low-voltage high-speed thin film transistors. The various numerical limitations were obtained by the present inventors having carried out a large number of experiments.

In accordance with another embodiment of the present invention, there is a method of fabricating a liquid crystal display device provided with a pixel area on a substrate having a plurality of gate lines, a plurality of drain lines, a plurality of thin film transistors and a plurality of pixel electrodes corresponding to the plurality of thin film transistors, and a drive circuit area disposed at a periphery of the substrate and having a drive circuit for driving the plurality of thin film transistors, the method comprising the steps of: (a) forming a first amorphous silicon semiconductor film on the substrate and then converting the amorphous silicon semiconductor film into a first polycrystalline silicon semiconductor film by laser annealing, (b) cleaning a surface of the first polycrystalline silicon semiconductor film and thereby reducing an amount of an unintentional impurity on the surface of the first polycrystalline silicon semiconductor film to $10^{19}$ atoms/cm$^3$ or less, (c) forming a second amorphous silicon semiconductor film on the first polycrystalline silicon semiconductor film and then converting the second amorphous silicon semiconductor film into a second polycrystalline silicon semiconductor film using crystals in the first polycrystalline silicon semiconductor film as nucleuses by laser annealing and thereby merging the second polycrystalline silicon semiconductor film with the first polycrystalline silicon semiconductor film into a polycrystalline silicon semiconductor layer, (d) patterning the polycrystalline silicon semiconductor layer into a thin-film-transistor polycrystalline silicon semiconductor layer, (e) forming a gate insulating layer on the thin-film-transistor polycrystalline silicon semiconductor layer, (f) forming a first electrode material film on the gate insulating layer and then patterning the first electrode material film into a gate electrode, (g) introducing impurities for determining a conductivity type into regions of the thin-film-transistor polycrystalline silicon semiconductor layer corresponding to a source electrode and a drain electrode, respectively, (h) forming an interlayer insulating layer to cover the gate electrode, (i) opening semiconductor-layer contact holes by selectively removing regions of the gate insulating layer and the interlayer insulating layer corresponding to the regions of the thin-film-transistor polycrystalline silicon semiconductor layer corresponding to the source electrode and the drain electrode, respectively, (j) forming a second electrode material film to contact the regions of the thin-film-transistor polycrystalline silicon semiconductor layer corresponding to the source electrode and the drain electrode, respectively, via the semiconductor-layer contact holes and to cover the interlayer insulating layer, (k) patterning the second electrode material film into the source electrode and the drain electrode, (l) forming a protective film to cover the source electrode, the drain electrode and the interlayer insulating layer, (m) selectively removing the protective film to open a source-electrode contact hole extending to the source electrode, (n) forming a pixel-electrode material film to contact the source electrode through the source-electrode contact hole and cover the protective film, and (o) patterning the pixel-electrode material film into a pixel electrode.

The above fabrication method provides liquid crystal display devices having an active matrix substrate including low-voltage high-speed thin film transistors, by reducing unevenness of the polycrystalline silicon semiconductor layer, making the insulating layer thinner and flattening the lateral distributions of impurity concentrations.

The above configurations provide liquid crystal display devices having an active matrix substrate including stable low-voltage high-speed thin film transistors. The various numerical limitations were obtained by the present inventors having carried out a large number of experiments.

The above fabrication provides liquid crystal display devices having an active matrix substrate including low-voltage high-speed thin film transistors, by reducing unevenness of the polycrystalline silicon semiconductor layer, making the insulating layer thinner and flattening the lateral distributions of impurity concentrations.

The present invention is not limited to the above configurations or embodiments described later, but various changes and modifications can be made to the above configurations and the embodiments without departing from the nature and spirit of the present invention.

BRIEF DESCRIPTION OF THE DRAWINGS

In the accompanying drawings, in which like reference numerals designate similar components throughout the figures, and in which:

FIG. 4A is a schematic cross-sectional view of a prior art polycrystalline silicon semiconductor layer, and FIG. 4B is a schematic cross-sectional view of a polycrystalline silicon semiconductor layer of the embodiment;

FIGS. 5A and 5B explain a comparison between the prior art and the embodiment of the present invention in connection with unevenness of the polycrystalline silicon semiconductor layers fabricated on the substrates and distributions of equipotential lines, FIG. 5A is a schematic cross-sectional view of a prior art polycrystalline silicon semiconductor layer, and FIG. 5B is a schematic cross-sectional view of a polycrystalline silicon semiconductor layer of the embodiment of the present invention;

FIGS. 7.1 to 7.18 are cross-sectional views of two thin film portions of an active matrix substrate of the liquid crystal display device in accordance with the present invention illustrating the steps of a first embodiment of a method of fabricating the liquid crystal display device of the present invention;

DETAILED DESCRIPTION OF THE PREFERRED EMBODIMENTS

The embodiments of the present invention will now be explained in detail with reference to the accompanying drawings.

Figure 1:
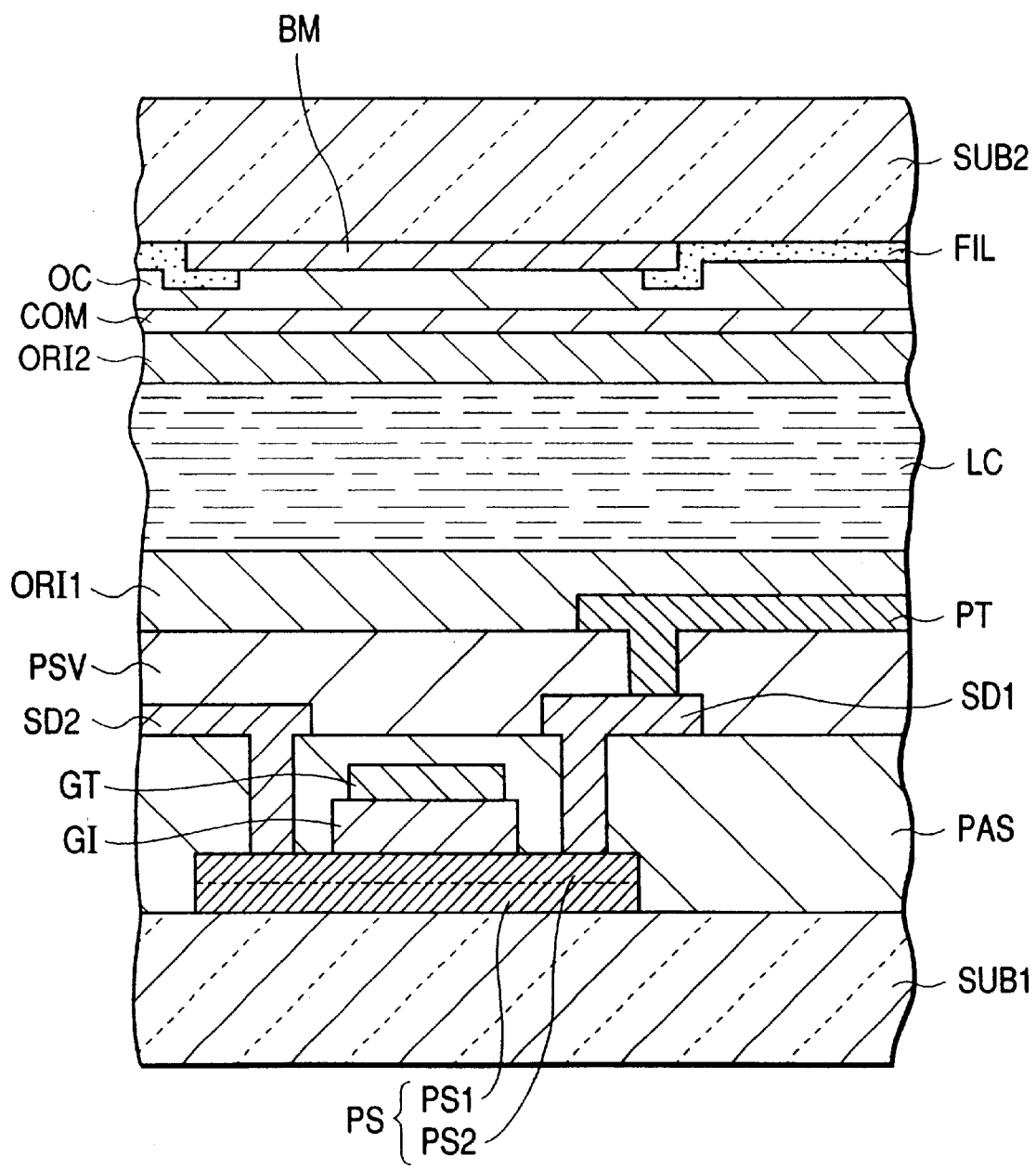
FIG. 1 is a cross-sectional view of an essential part of a first embodiment of a liquid crystal display device in accordance with the present invention.
Figure 2:
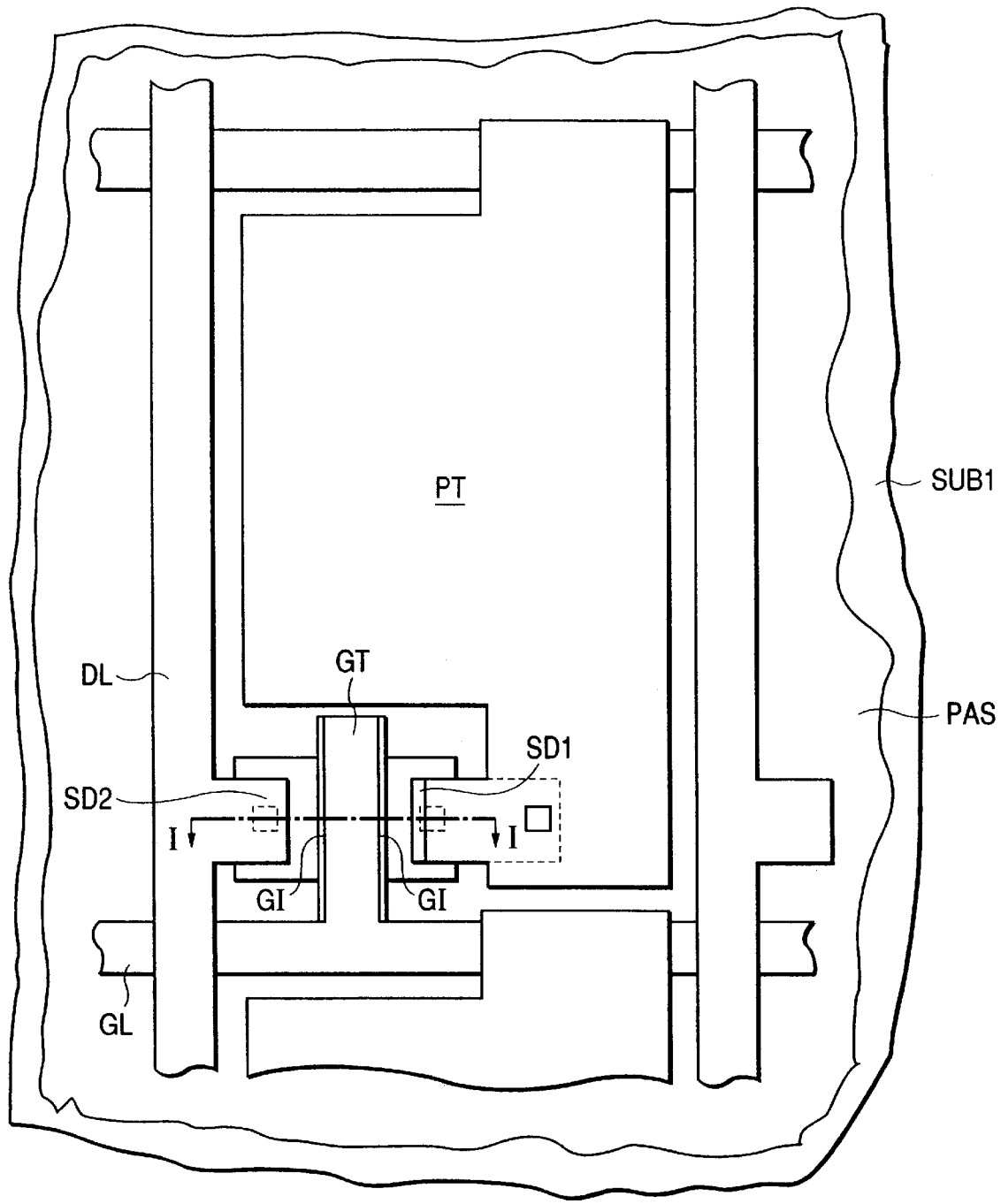
FIG. 2 is a plan view of a pixel and its vicinity in a first embodiment of an active matrix substrate constituting the liquid crystal display device in accordance with the present invention.

FIG. 1 is a cross-sectional view of an essential part of a first embodiment of the liquid crystal display device in accordance with the present invention. FIG. 2 is a plan view of a pixel and its vicinity in a first embodiment of an active matrix substrate constituting the liquid crystal display device in accordance with the present invention, the same reference characters as utilized in FIG. 1 designate functionally similar parts or portions in FIG. 2. FIG. 1 is a cross-sectional view taken along line I—I of FIG. 2.

In FIGS. 1 and 2, reference character SUB1 denotes an active matrix substrate (a first substrate), which is made of glass in this embodiment. Formed on the substrate SUB1 is a polycrystalline silicon semiconductor layer PS comprised of a first (lower) layer made of a polycrystalline silicon semiconductor layer PS1 and a second (upper) layer made of a polycrystalline silicon semiconductor layer PS2, and then stacked on the substrate SUB1 in the order named are a gate insulating film GI, a gate electrode GT, a source electrode SD1, a drain electrode SD2, an insulating film PAS, a protective film PSV, a pixel electrode PT and an orientation control film ORI1.

A buffer layer made of $SiO_2$ or SiN is sometimes disposed on the surface of the glass substrate SUB1, but in this embodiment the buffer layer is omitted.

In explaining the following embodiments, when the buffer layer is disposed on the surface of the glass substrate SUB1, the substrate including the buffer layer thereon is referred to merely as the substrate.

The source electrode SD1 and the drain electrode SD2 are formed on the polycrystalline silicon semiconductor layer PS through contact holes opened in the insulating layer PAS. The source electrode SD1 is electrically connected to the pixel electrode PT via a source-electrode contact hole opened in the protective film PSV.

The polycrystalline silicon semiconductor layer PS is fabricated by forming a first polycrystalline silicon semiconductor layer PS1 and next a second polycrystalline silicon semiconductor layer PS2 thereon and then laser annealing the first and second polycrystalline silicon semiconductor layers PS1 and PS2 as explained subsequently in connection with its fabrication method such that crystals grow so large as to extend into the second polycrystalline silicon semiconductor layer PS2, by using as nucleuses portions of the first polycrystalline silicon semiconductor layer PS1 which are remaining unmelted regardless of the laser annealing, unevenness of the surface of the polycrystalline silicon semiconductor layer PS is equal to or less than 10% of the entire thickness of the polycrystalline silicon semiconductor layer PS, and variations in positions of peaks of depth distributions of impurity concentrations are equal to or less than 10% of the entire thickness of the polycrystalline silicon semiconductor layer PS with respect to the surface of the substrate.

The unevenness of the surface of the polycrystalline silicon semiconductor layer and the variations of positions of the peaks of depth distributions of concentration of the impurities are measured under the gate insulating film.

On the other hand, formed on the inner surface of the other substrate SUB2 preferably made of glass are a plurality of color filters FIL each defined by a black matrix BM, and stacked on the color filters FIL on the order named are a planarizing layer (an overcoat layer) OC, a common electrode COM and an orientation control film ORI2.

The present embodiment is intended to display a color image and therefore the substrate SUB2 is provided with the color filters FIL, but in case of a monochrome liquid crystal display device, the substrate SUB2 is not provided with the color filters FIL.

Figure 8:
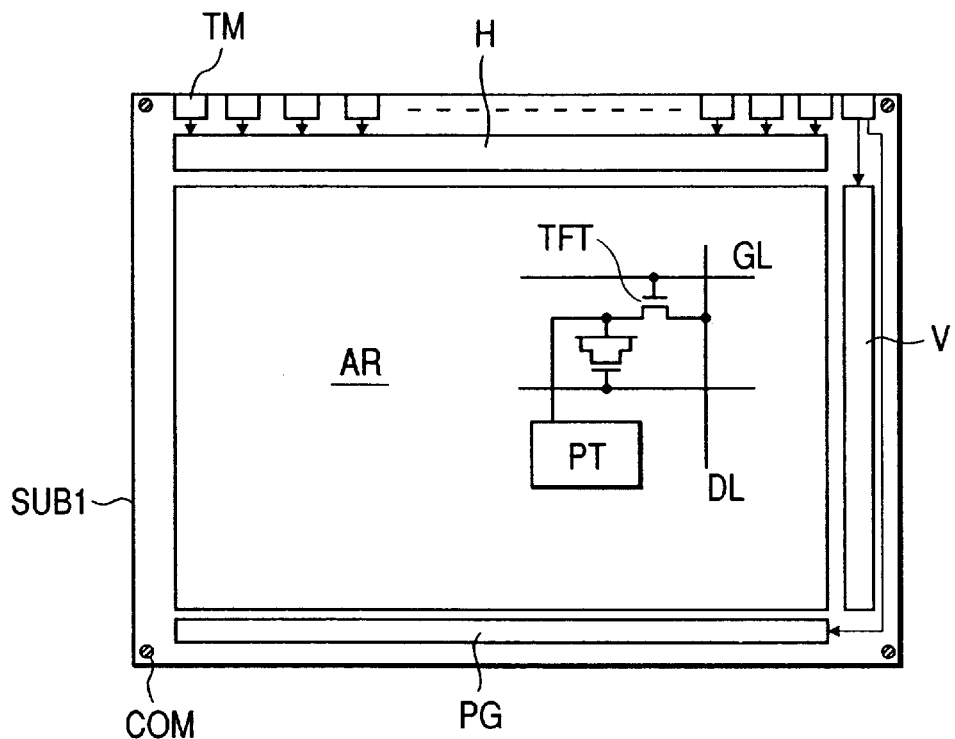
FIG. 8 is a schematic plan view of an active matrix substrate for explaining an example of a liquid crystal display device which uses polycrystalline silicon semiconductors.
Figure 9:
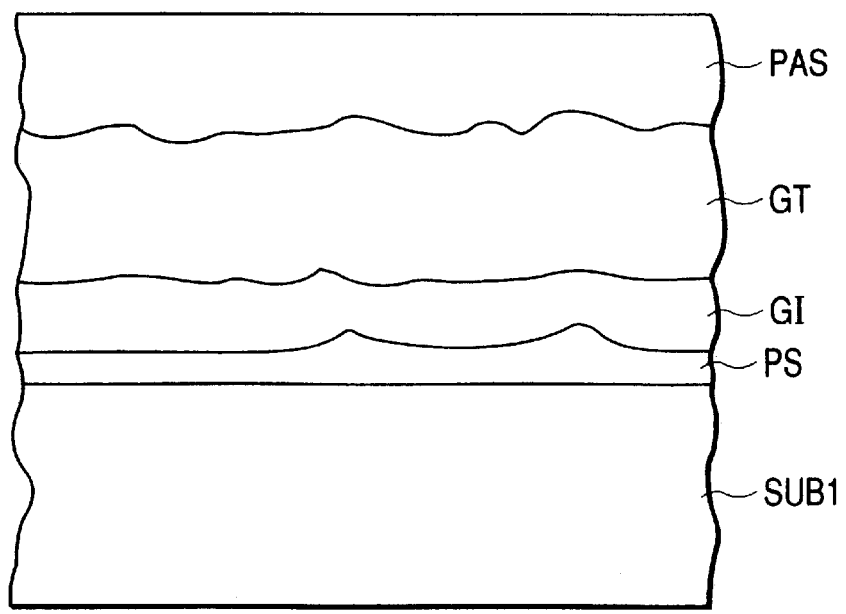
FIG. 9 is a sketch reproduced from a micrograph of a structural cross section of stacked films at an essential part of a thin film transistor fabricated on an active matrix substrate constituting a prior art liquid crystal display device.

The two substrates SUB1 and SUB2 sandwich a liquid crystal layer LC therebetween, and are sealed together at the periphery of a display area shown in FIG. 8 with a sealing member (not shown).

Figure 3:
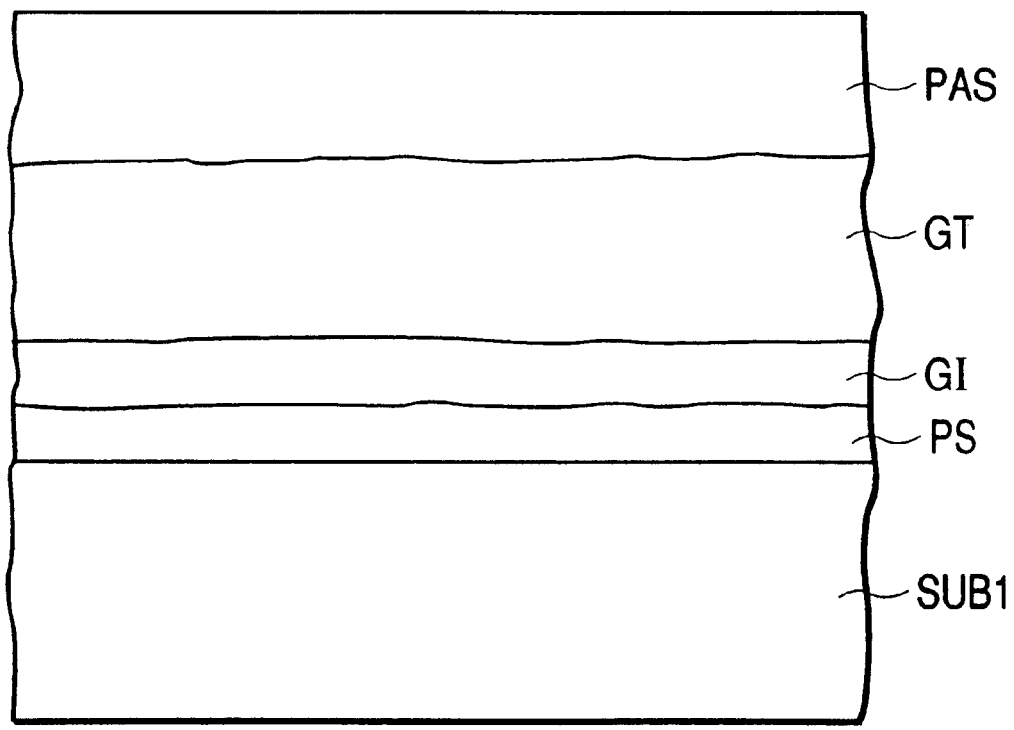
FIG. 3 is a sketch reproduced from a micrograph of a structural cross section of stacked films at an essential part of a thin film transistor fabricated on the active matrix substrate constituting the liquid crystal display device in accordance with the present invention.

FIG. 3 is a sketch reproduced from a micrograph of a structural cross section of stacked films at an essential part of a thin film transistor fabricated on an active matrix substrate constituting the liquid crystal display device in accordance with the present invention. In FIG. 3, reference character SUB1 denotes the active matrix substrate, and stacked on the active matrix substrate SUB1 in the order named are the polycrystalline silicon semiconductor layer PS, the gate insulating layer GI, the gate electrode GT and the insulating film PAS.

In the present invention, by irradiation of a laser beam for forming the polycrystalline silicon semiconductor layer constituting the second layer, the polycrystalline silicon of the second layer and that of the first layer melt together and merge with each other, and consequently, in the sketch reproduced from the micrograph of the structural cross section, a boundary is not detectable between the first and second polycrystalline silicon semiconductor layers PS1, PS2 constituting the semiconductor layer PS. Differences in height between peaks and valleys measured 10 nm or less in the surface of the polycrystalline silicon semiconductor layer PS shown in FIG. 3.

The unevenness of the surface of the polycrystalline silicon semiconductor layer PS can be measured by using an atomic force microscope (AFM).

The active matrix substrate of the present embodiment has reduced the unevenness of the surface of the polycrystalline a silicon semiconductor layer PS of the thin film transistor and provides the following advantages:

(1) According to the amount of reduction of unevenness of the polycrystalline silicon semiconductor layer PS, the thickness of an insulating layer (e.g., a gate insulating layer GI) can be reduced which has been made thick enough to cover large protrusions for ensuring desired dielectric strength between the gate electrode and the polycrystalline silicon layer.

The reduction in thickness of the gate insulating layer heightens the effect (the electric field) on the polycrystalline silicon semiconductor layer PS of a voltage applied to the gate electrode, and consequently, ON/OFF characteristics of the gate electrode is improved even if the same voltage is applied to the gate electrode.

In a liquid crystal display device using thin film transistors of the above configuration as its active elements, a high electric field can be applied to a semiconductor layer and mobility is improved, and therefore ON characteristics is improved and speed-up of circuits, and further, leakage currents between the source and the drain at a reduced gate voltage are reduced, and OFF characteristics are improved, and consequently, the drive circuits are stabilized and especially, leakage currents of the thin film transistors in the OFF state are greatly suppressed when the thin film transistors are used as switching elements for pixel driving with their source electrodes acting as liquid crystal drive electrodes in a floating state.

(2) By reducing unevenness of the polycrystalline silicon semiconductor layer, contours of equal-impurity concentrations of impurities incorporated subsequently can be made close to a line parallel to a surface of the substrate (a horizontal line), and as a result this realizes stabilized characteristics and high performance of the transistors.

Figure 4B:
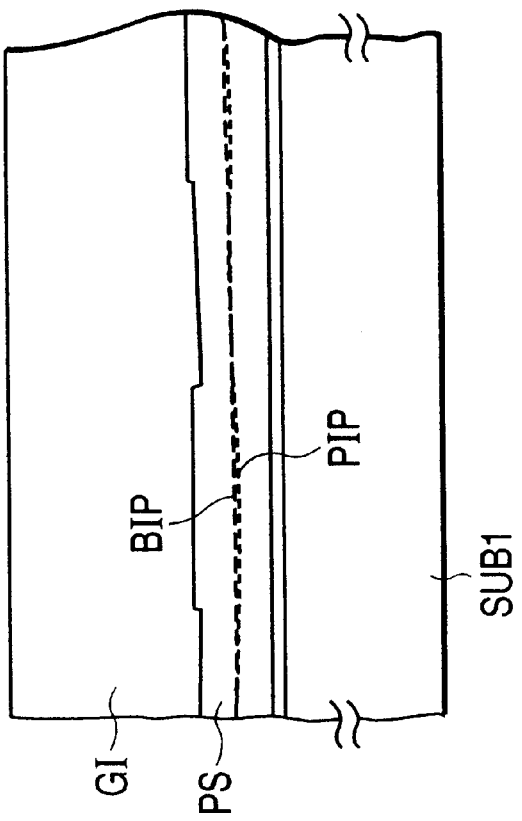
FIGS. 4A and 4B explain a comparison between the prior art and an embodiment of the present invention in connection with unevenness of the polycrystalline silicon semiconductor layers fabricated on the substrates and positions of peaks of depth distributions of concentration of implanted impurities.
Figure 4A:
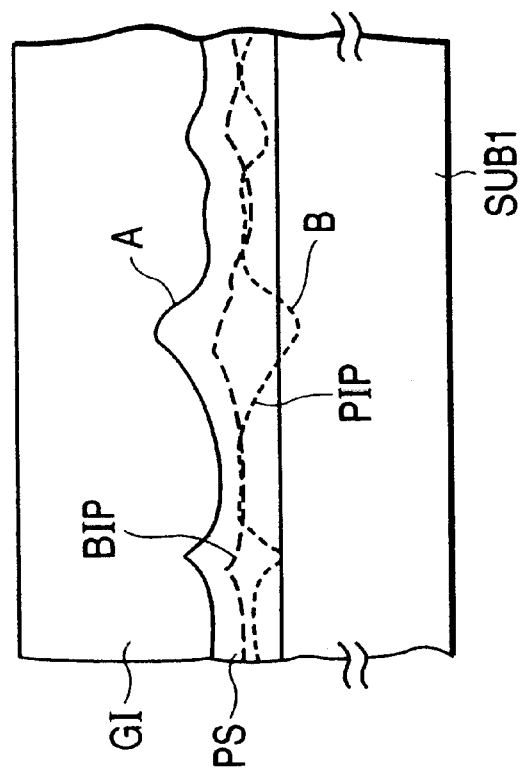

FIGS. 4A and 4B explain a comparison between the prior art and the present embodiment in connection with unevenness of the polycrystalline silicon semiconductor layers fabricated on the substrates and positions of peaks of depth distributions of concentration of implanted impurities, FIG. 4A is a schematic cross-sectional view of a prior art polycrystalline silicon semiconductor layer, and FIG. 4B is a schematic cross-sectional view of a polycrystalline silicon semiconductor layer of the present embodiment.

In FIGS. 4A and 4B, reference character SUB1 denotes the substrate, PS is the polycrystalline silicon semiconductor layer, GI is the gate insulating layer, curves BIP are curves connecting positions of peaks of depth distributions of concentration of implanted boron (B), and curves PIP are curves connecting positions of peaks of depth distributions of concentration of implanted phosphorus (P).

In a process in which the gate insulating film GI is fabricated on the polycrystalline silicon semiconductor layer PS and then an impurity is implanted into the polycrystalline silicon semiconductor layer PS using the gate insulating film GI as a mask, under some film forming conditions, the gate insulating film GI is fabricated in the form conforming to the unevenness to the surface of the underlying polycrystalline silicon semiconductor layer PS, but it is possible to form the insulating layer GI so as to absorb unevenness of the underlying polycrystalline silicon semiconductor layer PS and provide an even surface as shown in FIG. 4A.

Next, we shall consider the situation illustrated in FIG. 4A. A distance from the top surface of the gate insulating layer GI to an interface between the gate insulating layer GI and the polycrystalline silicon semiconductor layer PS varies according to the unevenness of the polycrystalline silicon semiconductor layer PS. The distances are short at peaks of the unevenness, and are long at valleys of the unevenness.

Positions of peaks of depth distributions of concentration of implanted boron (B) and phosphorus (P) which are generally used as impurities are as indicated by the curves BIP and PIP, respectively, in FIG. 4A.

Next, we shall consider a case where the gate insulating layer GI is made of $SiO_2$, as an example.

A mean penetration range of the impurity boron (B) in $SiO_2$ is approximately equal to that of the impurity boron (B) in Si, and consequently, a distribution of positions of peaks of depth distributions of concentration of the implanted impurity boron (B) conforms to the unevenness of the polycrystalline silicon semiconductor layer and is within the polycrystalline silicon semiconductor layer PS.

On the other hand, a mean penetration range of the impurity phosphorus (P) in Si is approximately 1.2 times that of the impurity phosphorus (P) in $SiO_2$, and consequently, the mean penetration range of the phosphorus (P) becomes greater in regions of Si corresponding to thin $SiO_2$ layers lying on peaks of the polycrystalline silicon semiconductor layer PS and therefore peaks of depth distributions of impurity concentrations are formed deeper toward the substrate, but the mean penetration range of the phosphorus (P) becomes shorter in regions of Si corresponding to thick $SiO_2$ layers lying on valleys of the polycrystalline silicon semiconductor layer PS and therefore peaks of depth distributions of impurity concentrations are formed at smaller depth.

Consequently, a distribution of positions of peaks of depth distributions of concentrations of the implanted impurity phosphorus (P) is similar to an inverted distribution of the unevenness of the polycrystalline silicon semiconductor layer PS. This phenomenon is pronounced in FIG. 4A illustrating the prior art polycrystalline silicon semiconductor layer.

Especially, when it is desired to position peaks of depth distributions of concentration of the implanted impurity phosphorus (P) within a thin polycrystalline silicon semiconductor layer PS, as illustrated in FIG. 4A, a position denoted by "B" of a peak of a depth distribution of concentration of the impurity phosphorus (P) is sometimes outside the polycrystalline silicon semiconductor layer PS at a great peak denoted by "A" of the polycrystalline silicon semiconductor layer PS.

If a distance between the surface of the substrate SUB1 and a peak position of a depth distribution of the impurity concentration in the polycrystalline silicon semiconductor layer PS varies from place to place on the insulating substrate SUB1, when the impurities are diffused by annealing the polycrystalline silicon semiconductor layer PS with laser or the like, there arises a problem in that variations in impurity concentration occur and stable thin film transistor characteristics are not obtained.

On the other hand, in the present embodiment illustrated in FIG. 4B, the unevenness of the polycrystalline silicon semiconductor layer PS is small, a distribution of positions of peaks of depth distributions of concentrations of each of the implanted impurities boron (B) and phosphorus (P) is approximately parallel with the surface of the substrate SUB1, and consequently, the above-mentioned distributions BIP and PIP of positions of peaks of depth distribution of concentrations of the implanted impurities boron (B) and phosphorus (P), respectively, are always within the polycrystalline silicon semiconductor layer PS.

Also in a region where a channel of an MOS transistor which is a field-effect type thin film transistor is formed below the gate electrode, various problems arise when unevenness of the polycrystalline silicon semiconductor layer is large.

FIGS. 5A and 5B explain a comparison between the prior art and the present embodiment in connection with unevenness of the polycrystalline silicon semiconductor layers fabricated on the substrates and distributions of equipotential lines, FIG. 5A is a schematic cross-sectional view of a prior art polycrystalline silicon semiconductor layer, and FIG. 5B is a schematic cross-sectional view of a polycrystalline silicon semiconductor layer of the present embodiment.

In each of FIGS. 5A and 5B, fine lines represent a distribution of equipotential lines in the polycrystalline silicon semiconductor layer PS when a voltage is applied to the gate electrode GT in such a polarity as to form a channel in the polycrystalline silicon semiconductor layer PS. For the sake of simplicity, it is assumed that concentration of the impurity is uniform below the gate electrode and variations in potential related to grain boundaries can be neglected.

In FIG. 5A, as the voltage applied to the gate electrode GT is increased, a high-potential equipotential line begins to appear from regions of large unevenness of the polycrystalline silicon semiconductor layer PS, and also equipotential lines within the polycrystalline silicon semiconductor layer PS are not parallel with the surface of the substrate SUB1, but undulated due to the unevenness of the polycrystalline silicon semiconductor layer PS.

On the other hand, in the present embodiment illustrated in FIG. 5B, the equipotential lines are approximately parallel with the surface of the substrate SUB1 because the unevenness of the polycrystalline silicon semiconductor layer PS is limited to 10% of its thickness.

Figure 6A:
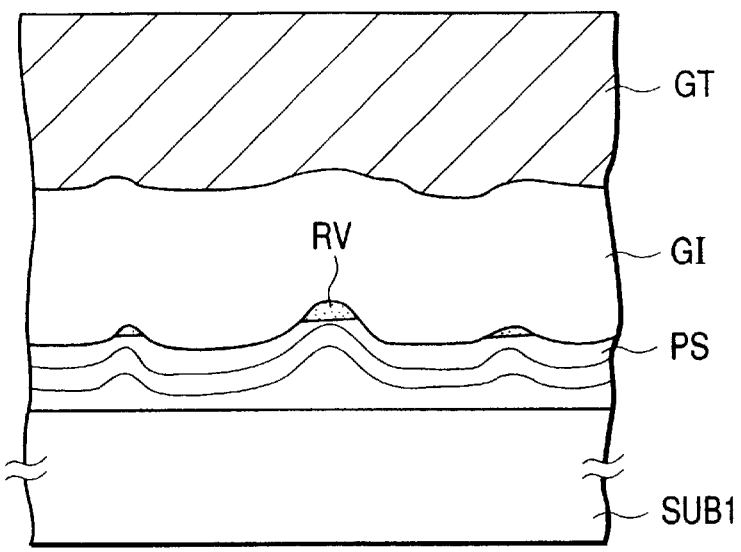
FIG. 6A is a schematic cross-sectional view of a prior art polycrystalline silicon semiconductor layer for explaining equipotential lines when the gate voltage of a thin film transistor is increased.

FIG. 6A is a schematic cross-sectional view of a prior art polycrystalline silicon semiconductor layer for explaining equipotential lines when the gate voltage of a thin film transistor is increased. FIG. 6A is an enlarged view of a portion labeled "a" in a cross-sectional view of the thin film transistor shown in FIG. 6B. As the gate electrode is increased, a channel CH is formed which connects a drain PS2 to a source PS1.

When the unevenness of the polycrystalline silicon semiconductor layer PS is large, as the gate voltage is increased, an inversion layer RV appears from a high-potential equipotential line. True electric charges begin to be locally accumulated by the inversion layer RV, this local accumulation of true electric charges changes a distribution of equipotential lines in the polycrystalline silicon semiconductor layer PS and the shape of the equipotential lines gradually conforms to the unevenness of the polycrystalline silicon semiconductor layer PS.

In this state, in the polycrystalline silicon semiconductor layer near an interface between the gate insulating film GI and the polycrystalline silicon semiconductor layer PS, a layer of accumulated true electric charges, i.e., the channel CH, is formed which connects the drain PS2 to the source PS1, and at this time, if a voltage difference exists between the drain PS2 and the source PS1, the MOS transistor is turned on and a current begins to flow between the drain PS2 and the source PS1.

In this situation, regions which locally accumulate true electric charges appear at very uneven portions of the polycrystalline silicon semiconductor layer PS, in the channel CH.

In operation of the MOS transistors of the above configuration, the following instability and structure-related degradation in performance characteristics are caused, resulting in unstable products or products having degraded their performance characteristics.

(1) A threshold voltage varies widely according to the unevenness of the polycrystalline silicon semiconductor layer. In one display device, a threshold voltage varies very widely from transistor to transistor, resulting in deterioration of characteristics and uniformity of image quality of the liquid crystal display device.

True electric charges locally accumulated at very uneven portions of the polycrystalline silicon semiconductor layer in the channel are excited into a state of a higher potential (a hot state) than that of normal true electric charges in the channel, and consequently, they are injected into the gate insulating layer GI at a gate voltage lower than a gate voltage at which the normal true electric charges in the channel are captured into the gate insulating layer GI as hot carriers, and therefore they vary characteristics such as a threshold voltage and also deteriorate reliability of the liquid crystal display device.

Further, the above phenomenon depends upon the degree of the unevenness of the polycrystalline silicon semiconductor layer and positions below the gate electrode, and therefore the performance characteristics vary very widely.

If local accumulation of true electric charges in the channel due to large unevenness of the polycrystalline silicon semiconductor layer occurs at a high voltage side (a drain side) of the channel, the accumulated true electric charges are attracted to the drain by the drain voltage. At this time, if an electric field at the drain is strong, the current becomes an impact current and causes a drain avalanche.

Further, this serves as a trigger to turn a parasitic bipolar transistor on at a low gate voltage, and a current begins to flow in a mode different from that with the MOS transistor controlled by the gate electrode, and it increases an apparent variation in the threshold voltage in addition to the above-explained instability of the threshold voltage, when the whole liquid crystal display device is considered.

Figure 6B:
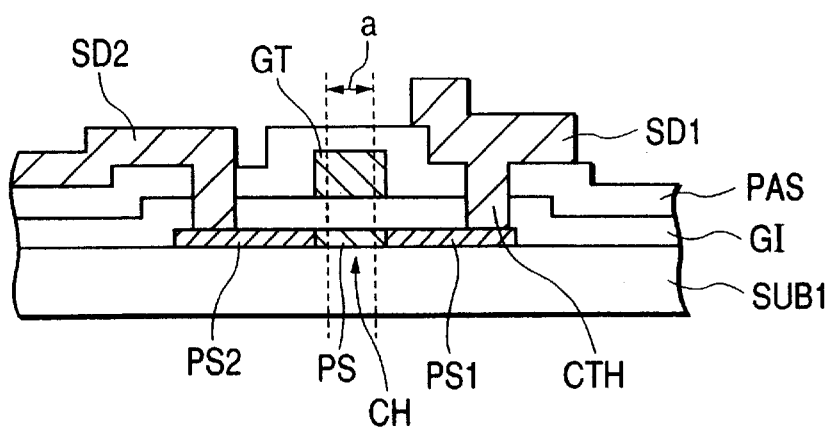
FIG. 6B is a cross-sectional view of a prior art thin film transistor.

Here we shall explain this phenomenon by using an n-channel thin film transistor as an example. In FIG. 6B, the parasitic bipolar transistor is formed by semiconductor layers of a drain (n-type) PS2, a channel portion (p-type) PS and a source (n-type) PS1 of the thin film transistor.

Figure 6C:
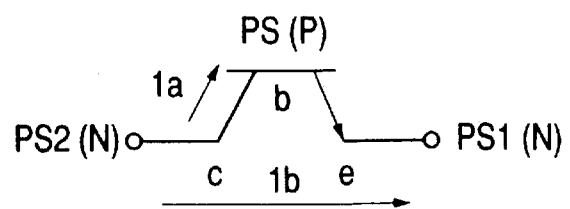
FIG. 6C shows an equivalent circuit of a parasitic bipolar transistor.

FIG. 6C shows an equivalent circuit of the parasitic bipolar transistor. If a drain avalanche occurs, a current Ia flows between the drain PS2 and the channel portion PS. Here, the drain PS2, the channel portion PS and the source PS1 act as a collector c, a base b and an emitter e, respectively, of the parasitic bipolar transistor, and therefore a current Ib triggered by the current Ia and incapable of being controlled by the gate GT flows between the drain PS2 and the source PS1.

In comparison with the above, in the thin film transistor provided with the polycrystalline silicon semiconductor layer having smaller unevenness in accordance with the present embodiment, equipotential lines in the polycrystalline silicon semiconductor layer are parallel with the surface of the substrate within 20% of the thickness of the polycrystalline silicon semiconductor layer, and therefore the above-explained locally high-potential portions do not occur easily and local accumulation of true electrical charges do not occur easily.

Consequently, the amount of locally accumulated true electric charges is small when the channel is formed, therefore the above mentioned problems with the prior art do not occur, or if they occur, the degree of their adverse effects are reduced, and consequently, a more stable and high-performance thin film transistor is formed. As a result, a stable and high-performance liquid crystal display device is obtained which is free from instability of characteristics and does not induce structure-related deterioration of characteristics easily.

The following explains an embodiment of fabricating a liquid crystal display device in accordance with the present invention by referring to FIGS. 7.1 to 7.18.

Embodiment 1

FIGS. 7.1 to 7.18 are cross-sectional views of two thin film portions of an active matrix substrate of the liquid crystal display device in accordance with the present invention illustrating the steps of a first embodiment of a method of fabricating the liquid crystal display device of the present invention. The method of the present embodiment includes the following steps (1) to (18).

In each of FIGS. 7.1 to 7.18 illustrating the cross-sectional views of the two thin film transistor portions of the active matrix substrate, an n-channel type thin film transistor (TFT1) and a p-channel type thin film transistor (TFT2) are shown at the left and at the right, respectively. In the present embodiment, the n-channel type thin film transistors (TFT1) and the p-channel type thin film transistors (TFT2) are fabricated on the same substrate SUB1 at the same time.

Step 1 (see FIG. 7.1)

First a first amorphous silicon semiconductor film PS-a is formed on the glass substrate SUB1 used as an insulating substrate by using chemical vapor deposition (hereinafter CVD), and then a first polycrystalline silicon semiconductor layer is formed by annealing the first amorphous silicon semiconductor film PS-a irradiating a laser beam thereto and thereby converting it into the polycrystalline silicon semiconductor layer. This process step is performed in a vacuum or a low-pressure atmosphere.

It is preferable to select the thickness of the first polycrystalline silicon semiconductor film to be equal to or less than 50 nm. It is more preferable that regions of the first polycrystalline silicon semiconductor film corresponding to the drain and the source are also equal to or less than 50 nm in thickness.

Step 2 (see FIG. 7.2)

After the substrate SUB1 is taken out from the vacuum or low-pressure chamber, a cleaning step is performed on the substrate SUB1 to reduce impurities or the constituent elements of air on the surface XX of the first polycrystalline silicon semiconductor film PS-a. At this time, the surface XX of the first polycrystalline silicon semiconductor film PS-a is removed by a small amount by etching and also protrusions produced by laser annealing in STEP 1 are etched such that the surface of the first polycrystalline silicon semiconductor film PS-a is planarized to some degree, a surface of a second amorphous silicon semiconductor film PS-b stacked thereon in subsequent STEP 3 also becomes flat, and consequently, a surface of a polycrystalline silicon semiconductor film PS formed by laser annealing in succeeding STEP 4 becomes extremely flat.

It is preferable that the amount to be etched away from the surface XX of the first polycrystalline silicon semiconductor film PS-a is such that the impurities and compounds of silicon with constituent elements of air on the surface XX of the first polycrystalline silicon semiconductor film PS-a are reduced to $10^{19}$ atoms/cm$^3$ or less.

Especially, a compound of silicon with oxygen of air prevents laser annealing in subsequent STEP 4 from melting together the first polycrystalline silicon semiconductor film PS-a and the second amorphous silicon semiconductor film PS-b and producing a polycrystalline silicon semiconductor film PS made of large grains and having good crystal quality, and therefore it is more preferable to reduce the concentration of oxygen on the surface of the first polycrystalline silicon semiconductor film PS-a to $10^{19}$ atoms/cm$^3$ or less, and it is also more preferable to reduce the concentration of nitrogen of air adsorbed on the surface of the first polycrystalline silicon semiconductor film PS-a to $10^{19}$ atoms/cm$^3$ or less, because the nitrogen prevents growth of crystals in the polycrystalline silicon semiconductor film PS. The unevenness of the surface of the first polycrystalline silicon semiconductor film is made within 10% of its thickness.

The amount of each of the impurities on the surface of the first polycrystalline silicon semiconductor film PS-a can be measured by using the secondary ion mass spectroscopy (SIMS).

One of methods of cleaning the surface of the polycrystalline silicon semiconductor film PS-a is exposing the surface of the film PS-a to hydrogen fluoride (HF). The exposure of the surface of the film PS-a to hydrogen fluoride can remove the compound of silicon with oxygen of air formed on the surface of the film PS-a.

Also a method of exposing the surface of the polycrystalline silicon semiconductor film PS-a to aqueous ammonia can clean the surface of the film PS-a.

Step 3 (see FIG. 7.3)

Immediately after STEP 2, the substrate SUB1 is put into a vacuum or low-pressure atmosphere, and then a second amorphous silicon semiconductor film PS-b is formed on the first polycrystalline silicon semiconductor film PS-a by using CVD as in STEP 1.

Constituent elements of air or other impurities stick again easily to the surface of the first polycrystalline silicon semiconductor film PS-a after the cleaning step, and therefore it is necessary to put the substrate SUB1 into the vacuum or low-pressure atmosphere before the concentration of the constituent elements of air and other impurities exceed $10^{19}$ atoms/cm$^3$ on the surface of the first polycrystalline silicon semiconductor film PS-a. It is preferable to select the thickness of the second amorphous silicon semiconductor film to be equal to or less than 50 nm. It is more preferable that regions of the second amorphous silicon semiconductor film corresponding to the drain and the source are also equal to or less than 50 nm in thickness.

Step 4 (see FIG. 7.4)

The second amorphous silicon semiconductor film PS-b is converted into a polycrystalline silicon semiconductor film by laser annealing the second amorphous silicon semiconductor film PS-a using crystals in the first polycrystalline silicon semiconductor film PS-a as nucleuses.

In STEP 4, the condition of laser irradiation during laser annealing is set such that the second polycrystalline silicon semiconductor film PS-b is completely melted, but portions of the underlying first polycrystalline silicon semiconductor film PS-a remain unmelted.

This takes advantage of the fact that the efficiency of heat generation by laser absorption in the crystalline portions is lower than that in the amorphous portions. In the process of crystallization by cooling after completion of laser irradiation, a polycrystalline silicon semiconductor film is obtained which has large crystals grown using as nucleuses the unmelted portions of the first polycrystalline silicon semiconductor film PS-a and extending from the first polycrystalline silicon semiconductor layer to the second polycrystalline silicon semiconductor layer and which has reduced the size of protrusions formed between the crystals extremely.

Step 5 (see FIG. 7.5)

The polycrystalline silicon semiconductor film PS is patterned into a polycrystalline silicon semiconductor layer PS of a thin film transistor.

Step 6 (see FIG. 7.6)

A gate insulating layer GI is formed on the polycrystalline silicon semiconductor layer PS. It is preferable to select the thickness of the gate insulating layer GI to be equal to or less than 80 nm.

Step 7 (see FIG. 7.7)

A mask RES made of material such as photoresist is formed on a portion of the polycrystalline silicon semiconductor layer PS intended for a p-channel type thin film transistor (TFT2), then impurities are introduced into a portion of the polycrystalline silicon semiconductor layer PS intended for an n-channel type thin film transistor (TFT1) so as to control a gate threshold voltage, and here ion species such as boron (B) are introduced as the impurities to induce the p-type conductivity.

Step 8 (see FIG. 7.8)

The portion of the polycrystalline silicon semiconductor layer PS intended for the n-channel type thin film transistor (TFT1) is covered with a mask as of photoresist, then impurities are introduced into the portion of the polycrystalline silicon semiconductor layer PS intended for the p-channel type thin film transistor (TFT2) so as to control a gate threshold voltage, and here ion species such as phosphorus (P) or arsenic (As) are introduced as the impurities to induce the n-type conductivity.

Thereafter, the portions of the polycrystalline silicon semiconductor layer PS corresponding to the thin film transistors of the n-channel type and p-channel type, respectively, are annealed by irradiation of a laser beam so as to diffuse the impurities introduced in STEP 7 and STEP 8 and to be activated.

Step 9 (see FIG. 7.9)

An electrode material film is coated on the gate insulating layer GI and is patterned into the gate electrodes GT.

Step 10 (see FIG. 7.10)

The portion of the polycrystalline silicon semiconductor layer PS intended for the p-channel type thin film transistor (TFT2) is covered with a mask RES as of photoresist, then impurities such as phosphorus (P) or arsenic (As) are introduced into regions of the polycrystalline silicon semiconductor layer PS corresponding to source and drain electrodes of the n-channel type thin film transistor so as to induce the n-type conductivity, and at this time the concentration of the impurities are selected to be low.

Incidentally, the introduction of these impurities can sometimes be omitted.

Step 11 (see FIG. 7.11)

The portion of the polycrystalline silicon semiconductor layer PS intended for the n-channel type thin film transistor (TFT1) is covered with a mask RES as of photoresist, then impurities are introduced into regions of the polycrystalline silicon semiconductor layer PS corresponding to source and drain electrodes of the p-channel type thin film transistor so as to induce the p-type conductivity by using the ion species such as boron (B), and at this time the concentration of the impurities are selected to be sufficient such that a source PS1 and a drain PS2 of the polycrystalline silicon semiconductor layer of the p-channel thin film transistor can form ohmic contacts with metal electrodes SD1 and SD2, respectively.

Step 12 (see FIG. 7.12)

The portion of the polycrystalline silicon semiconductor layer PS intended for the p-channel type thin film transistor (TFT2) is covered with a mask RES as of photoresist, also sidewalls of the gate electrode GT and its vicinities of the n-channel type thin film transistor (TFT1) are covered with a mask RES as of photoresist, and then impurities are introduced into regions of the polycrystalline silicon semiconductor layer PS corresponding to source and drain electrodes of the n-channel type thin film transistor so as to induce the n-type conductivity by using the ion species such as phosphorus (P) or arsenic (As), and at this time the concentration of the impurities are selected to be sufficient such that a source PS1 and a drain PS2 of the polycrystalline silicon semiconductor layer of the n-channel thin film transistor can form ohmic contacts with metal electrodes SD1 and SD2, respectively. Thereafter, the portions of the polycrystalline silicon semiconductor layer PS corresponding to the thin film transistors of the n-channel type and p-channel type, respectively, are annealed by irradiation of a laser beam so as to diffuse the impurities introduced in STEP 10, STEP 11 and STEP 12 and to be activated.

In the present embodiment, introduction of the impurities into the region of the polycrystalline silicon semiconductor layer PS corresponding to the source PS1 and the drain PS2 of the n-channel type thin film transistor is divided into STEP 10 and STEP 12, therefore the gradient of concentration of the impurities at the ends of the gate electrode GT is made gentle, and consequently, the n-channel type thin film transistor is not broken even if a high voltage is applied between its source PS1 and its drain S2. Especially, the n-channel type thin film transistor is also used as a switch for selecting a pixel electrode as shown in FIG. 1, and consequently, high reliability is required of the n-channel type thin film transistors (TFT1) to eliminate defective pixels.

Step 13 (see FIG. 7.13)

An interlayer insulating layer PAS is formed to cover the gate electrode GT.

Step 14 (see FIG. 7.14)

The gate insulating layer GI and the interlayer insulating layer PAS are selectively removed in their regions corresponding to the source PS1 and the drain PS2 of the polycrystalline silicon semiconductor layer so as to open first contact holes CTH.

Step 15 (see FIG. 7.15)

An electrode material is coated such that it contacts the source PS1 and the drain PS2 of the polycrystalline silicon semiconductor layer through the first contact holes CTH and covers the interlayer insulating layer PAS, and then the electrode material film is patterned into the source electrodes SD1 and the drain electrodes SD2.

Step 16 (see FIG. 7.16)

A protective film PSV is formed to cover the source electrodes SD1, the drain electrodes SD2 and the interlayer insulating layer PAS.

Step 17 (see FIG. 7.17)

The protective film PSV is selectively removed to open a second contact hole CTH2 extending to the source electrode SD1.

Step 18 (see FIG. 7.18)

A pixel electrode material is coated such that it contacts the source electrode SD1 through the second contact hole CTH2 and covers the protective film PSV, and then the pixel electrode material film is patterned into the pixel electrode PT. Thereafter, a protective film is formed and then an orientation control film ORI1 is formed thereon to complete the active matrix substrate.

The method of fabrication of this embodiment provides a liquid crystal display device having an active matrix substrate including low-voltage high-speed thin film transistors by reducing unevenness of the polycrystalline silicon semiconductor layer, making the insulating layer thinner and flattening the lateral distributions of impurity concentrations.

Embodiment 2

The features of Embodiment 2 of a method of fabricating a liquid crystal display device according to the present invention are that a cleaning step corresponding to STEP 2 in Embodiment 1 is performed without exposing the substrate SUB1 to air, and STEPs 1 to 4 in Embodiment 1 are performed continuously in a vacuum or low-pressure atmosphere. The remaining steps in Embodiment 2 are the same as those in Embodiment 1.

In Embodiment 2, the surface XX of the polycrystalline silicon semiconductor layer PS-a is removed by dry etching without exposing the surface XX to air, and thereby protrusions produced by laser annealing in STEP 1 is etched such that the surface of the first polycrystalline silicon semiconductor film PS-a is planarized to some degree, a surface of a second amorphous silicon semiconductor film PS-b stacked thereon in subsequent STEP 3 also becomes flat, and consequently, a surface of a polycrystalline silicon semiconductor film PS formed by laser annealing in succeeding STEP 4 becomes extremely flat.

Figure 10:
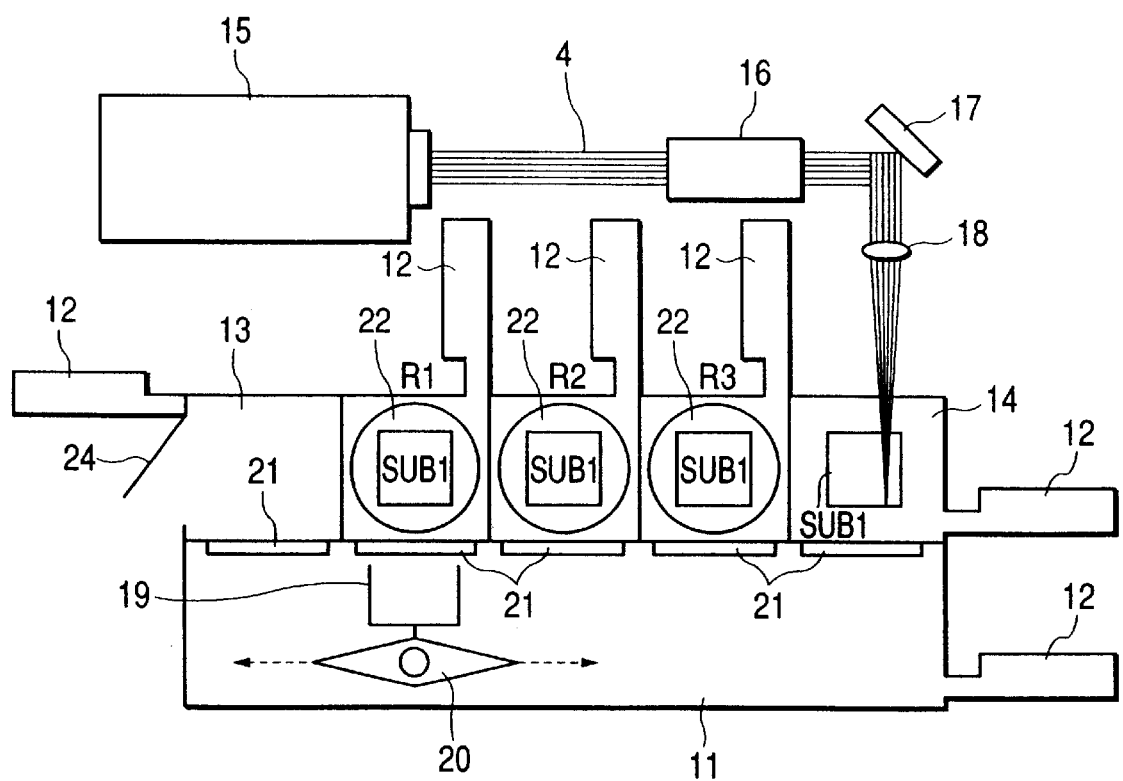
FIG. 10 is a schematic illustrating an example of fabrication equipment for performing STEPs 1 to 4 of Embodiment 2 on the substrate SUB1 without exposing the substrate SUB1 to air.

FIG. 10 is a schematic illustrating an example of fabrication equipment for performing STEPs 1 to 4 of Embodiment 2 on the substrate SUB1 without exposing the substrate SUB1 to air.

Reference numeral 11 denotes a substrate-conveyor room, 19 are robot arms for holding a substrate, 20 is a mechanism for conveying the robot arms 19, 12 is a vacuum pump for evacuating the substrate-conveyor room 11, 13 is a take-in room for taking the substrates into the equipment, and 24 is a door used for taking in or out the substrates therefrom.

Reference character R1 is a first room for depositing a semiconductor film on a substrate, R2 is a second room for depositing an insulating film on the substrate, R3 is a third room for dry-etching the surface of the semiconductor film formed on the substrate and thereby cleaning the surface, reference numeral 14 denotes a fourth room for annealing the semiconductor film formed on the substrate by irradiating laser light 4 onto its surface, 15 is a laser light source, 16 is a homogenizer for homogenizing the laser light 4, 17 is a reflector, and 18 is a condenser lens.

The laser light 4 is introduced into the fourth room 14 via a transparent window (not shown) provided therein. The take-in room 13, the first room R1, the second room R2, the third room R3 and the fourth room 14 communicate with the substrate-conveyor room 11 via respective doors 21. All the rooms are evacuated by the vacuum pump 12.

The features of Embodiment 2 will be explained by using the schematic of the fabrication equipment shown in FIG. 10 and the sequence of the steps shown on FIGS. 7.1 to 7.18.

Step 1

First, the insulating substrate SUB1 is taken into the take-in room 13, and next it is placed on a stage 22 in the first room R1 by the robot arms 19 and then it is fixed on the stage 22. Then Material gases are introduced into the first room R1 and a first amorphous silicon semiconductor film PS-a is fabricated on the insulating substrate SUB1 by CVD. Thereafter, the substrate SUB1 is moved into the fourth room 14 by the robot arms 19, is fixed on a stage, and then the first amorphous silicon semiconductor film PS-a is converted into the first polycrystalline silicon semiconductor film by annealing the first amorphous silicon semiconductor film PS-a irradiating laser light thereto. This step is performed continuously without exposing the substrate SUB1 to air.

Step 2

The substrate SUB1 is moved into the third room R3 by the robot arms 19 and then is fixed on a stage 22. Next, a cleaning step is performed by introducing etching gases into the third room R3 and thereby removing silicon compounds (silicon oxides or silicon nitrides, for example) and other impurities on the surface XX of the first polycrystalline silicon semiconductor film PS-a by dry-etching.

At this time, the surface XX of the polycrystalline silicon semiconductor film PS-a is removed by a small amount by etching and also protrusions produced by laser annealing in STEP 1 are etched such that the surface of the first polycrystalline silicon semiconductor film PS-a is planarized to some degree, a surface of a second amorphous silicon semiconductor film PS-b stacked thereon in subsequent STEP 3 also becomes flat, and consequently, a surface of a polycrystalline silicon semiconductor film PS formed by laser annealing in succeeding STEP 4 becomes extremely flat.

It is preferable that the amount to be etched away from the surface XX of the first polycrystalline silicon semiconductor film PS-a is such that the concentration of unintentional impurities on the surface XX of the first polycrystalline silicon semiconductor film PS-a is reduced to $10^{19}$ atoms/$cm^3$ or less.

Especially, a compound of silicon with oxygen prevents laser annealing in subsequent STEP 4 from melting together the first polycrystalline silicon semiconductor film PS-a and the second amorphous silicon semiconductor film PS-b and producing a polycrystalline silicon semiconductor film PS made of large grains and having good crystal quality, and therefore it is more preferable to reduce the concentration of oxygen on the surface of the first polycrystalline silicon semiconductor film PS-a to $10^{19}$ atoms/$cm^3$ or less. It is also more preferable to reduce the concentration of nitrogen on the surface of the first polycrystalline silicon semiconductor film PS-a to $10^{19}$ atoms/cm$^3$ or less, because silicon nitride formed on the surface the first polycrystalline silicon semiconductor film PS-a prevents growth of crystals in the polycrystalline silicon semiconductor film PS.

As a method of cleaning the surface of the polycrystalline silicon semiconductor film PS-a, it suffices to create a plasma by using a mixed gas of $CF_4$ and $O_2$ as an etching gas and to etch the surface of the polycrystalline silicon semiconductor film PS-a for an extremely short time of 5 to 10 seconds. This step is also performed continuously without exposing the substrate SUB1 to air.

Step 3

After STEP 2, the substrate SUB1 is moved into the third room R3 via the evacuated substrate-conveyor room 11 by the robot arms 19, then is fixed on a stage 22, and then a second amorphous silicon semiconductor film PS-b is formed on the first polycrystalline silicon semiconductor film PS-a by using CVD as in STEP 1.

In this Embodiment, the second amorphous silicon semiconductor film PS-b is formed on the first polycrystalline silicon semiconductor film PS-a without exposing the substrate SUB1 to air after the cleaning step, and consequently, constituent elements of air or other impurities do not stick to the surface of the first polycrystalline silicon semiconductor film PS-a again.

Step 4

The substrate SUB1 is moved into the fourth room 14 by the robot arms 19, then is fixed on a stage 22, and then the second amorphous silicon semiconductor film PS-b is converted into a polycrystalline silicon semiconductor film by laser annealing the second amorphous silicon semiconductor film PS-a using crystals in the first polycrystalline silicon semiconductor film PS-a as nucleuses.

At this time, the condition of laser irradiation during laser annealing is set such that the second polycrystalline silicon semiconductor film PS-b is completely melted, but portions of the underlying first polycrystalline silicon semiconductor film PS-a remain unmelted.

This takes advantage of the fact that the efficiency of heat generation by laser absorption in the crystalline portions is lower than that in the amorphous portions. In the process of crystallization by cooling after completion of laser irradiation, a polycrystalline silicon semiconductor film is obtained which has large crystals grown using as nucleuses the unmelted portions of the first polycrystalline silicon semiconductor film PS-a and extending from the first polycrystalline silicon semiconductor film to the second polycrystalline silicon semiconductor film and which has reduced the size of protrusions formed between the crystals extremely.

The remaining steps after STEP 4 are the same as those in Embodiment 1.

The method of fabrication of this embodiment also provides a liquid crystal display device having an active matrix substrate including low-voltage high-speed thin film transistors by reducing unevenness of the polycrystalline silicon semiconductor layer, making the insulating layer thinner and flattening the lateral distributions of impurity concentrations.

In the fabrication method of Embodiment 2, at least STEPs 1 to 4 can be performed without exposing the substrate SUB1 to air, and peaks of depth distributions of concentration of constituent elements of air (oxygen and nitrogen, for example) do not occur at an interface or its vicinities between the first-layer and second-layer polycrystalline silicon semiconductor films PS-a and PS-b.

Therefore, the present embodiment can make the first-layer and second-layer polycrystalline silicon semiconductor films PS-a, PS-b melt together and merger with each other without interferences by constituent elements of air.

The amount of each of the impurities at the interface between the first and second polycrystalline silicon semiconductor films PS-a can be measured by using the secondary ion mass spectroscopy (SIMS).

Embodiment 3

In this Embodiment of a method of fabricating a liquid crystal display device according to the present invention, the substrate SUB1 is exposed to air in a cleaning step corresponding to STEP 2 in Embodiment 1 and then a surface of the first-layer polycrystalline silicon semiconductor film PS-a is made flat by polishing the surface of the film PS-a and at the same time silicon compounds such as silicon oxide and silicon nitride on the surface of the film PS-a are removed.

The remaining steps in Embodiment 3 are the same as those in Embodiment 1.

In Embodiment 3, the surface XX of the polycrystalline silicon semiconductor film PS-a is removed by polishing and thereby protrusions produced by laser annealing in STEP 1 are removed such that the surface of the first polycrystalline silicon semiconductor film PS-a is made extremely flat, and as a result, a surface of a second amorphous silicon semiconductor film PS-b stacked thereon in subsequent STEP 3 also becomes flat, and consequently, a surface of a polycrystalline silicon semiconductor film PS formed by laser annealing in succeeding STEP 4 becomes extremely flat.

One of methods for polishing the surface of the polycrystalline silicon semiconductor film is a chemical mechanical polishing (CMP) method.

Specifically, abrasives dispersed in liquid is applied on a rotary table, the substrate SUB1 is placed on the rotary table with the surface of the first-layer polycrystalline silicon semiconductor film PS-a of the substrate SUB1 in contact with the abrasive-applied surface of the rotary table. The surface of the first-layer polycrystalline silicon semiconductor film PS-a is polished to be made flat by rotating the table. As abrasives, fine powders as of diamond can be used.

The remaining steps after the above steps are the same as those in Embodiment 1.

Each of the above embodiments of the methods of fabrication provides an active matrix substrate including low-voltage high-speed thin film transistors by reducing unevenness of the polycrystalline silicon semiconductor layer, making the insulating layer thinner and flattening the lateral distributions of impurity concentrations.

As explained above, the present invention provides a liquid crystal display device having an active matrix substrate including stable low-voltage high-speed thin film transistors by reducing unevenness of the polycrystalline silicon semiconductor layer, making the insulating layer thinner and flattening the lateral distributions of impurity concentrations.

What is claimed is:

1. A liquid crystal display device provided with a pixel area on a substrate having a plurality of gate lines, a plurality of drain lines, a plurality of thin film transistors and a plurality of pixel electrodes corresponding to said plurality of thin film transistors, and a drive circuit area disposed at a periphery of said substrate and having a drive circuit for driving said plurality of thin film transistors, said plurality of thin film transistors comprising:
a polycrystalline silicon semiconductor layer formed on said substrate of a stack of recrystallized semiconductor layers, a gate electrode formed on said polycrystalline silicon semiconductor layer with a gate insulating film interposed therebetween, an insulating film to cover said polycrystalline silicon semiconductor layer, said gate insulating film and said gate electrode, a drain electrode formed on said insulating film and electrically connected to said polycrystalline silicon semiconductor layer, and a source electrode formed on said insulating film, spaced from said drain electrode and electrically connected to said polycrystalline silicon semiconductor layer,
unevenness of a surface of said polycrystalline silicon semiconductor layer being within 10% of a thickness of said polycrystalline silicon semiconductor layer, and
variations of positions of peaks of depth distributions of concentration of impurities introduced into said polycrystalline silicon semiconductor layer to determine a conductivity type thereof being within 10% of said thickness of said polycrystalline silicon semiconductor layer, said positions of said peaks being with respect to a surface of said substrate.

2. A liquid crystal display device according to claim 1, wherein said unevenness of said surface of said polycrystalline silicon semiconductor layer and said variations of positions of the peaks of depth distributions of concentration of the impurities are present under said gate insulating film.

3. A liquid crystal display device provided with a pixel area on a substrate having a plurality of gate lines, a plurality of drain lines, a plurality of thin film transistors and a plurality of pixel electrodes corresponding to said plurality of thin film transistors, and a drive circuit area disposed at a periphery of said substrate and having a drive circuit for driving said plurality of thin film transistors,
said plurality of thin film transistors comprising:
a polycrystalline silicon semiconductor layer formed on said substrate of a stack of recrystallized semiconductor layers,
a gate electrode formed on said polycrystalline silicon semiconductor layer with a gate insulating film interposed therebetween,
an insulating film to cover said polycrystalline silicon semiconductor layer, said gate insulating film and said gate electrode,
a drain electrode formed on said insulating film and electrically connected to said polycrystalline silicon semiconductor layer, and
a source electrode formed on said insulating film, spaced from said drain electrode and electrically connected to said polycrystalline silicon semiconductor layer,
unevenness of a surface of said polycrystalline silicon semiconductor layer being within 10% of a thickness of said polycrystalline silicon semiconductor layer.

4. A liquid crystal display device according to claim 3, wherein said unevenness of said surface of said polycrystalline silicon semiconductor layer is present under said gate insulating film.

5. A liquid crystal display device provided with a pixel area on a substrate having a plurality of gate lines, a plurality of drain lines, a plurality of thin film transistors and a plurality of pixel electrodes corresponding to said plurality of thin film transistors, and a drive circuit area disposed at a periphery of said substrate and having a drive circuit for driving said plurality of thin film transistors,
said plurality of thin film transistors comprising:
a polycrystalline silicon semiconductor layer formed on said substrate of a stack of recrystallized semiconductor layers,
a gate electrode formed on said polycrystalline silicon semiconductor layer with a gate insulating film interposed therebetween,
an insulating film to cover said polycrystalline silicon semiconductor layer, said gate insulating film and said gate electrode,
a drain electrode formed on said insulating film and electrically connected to said polycrystalline silicon semiconductor layer, and
a source electrode formed on said insulating film, spaced from said drain electrode and electrically connected to said polycrystalline silicon semiconductor layer,
variations of positions of peaks of depth distributions of concentration of impurities introduced into said polycrystalline silicon semiconductor layer to determine a conductivity type thereof being within 10% of said thickness of said polycrystalline silicon semiconductor layer, said positions of said peaks being with respect to a surface of said substrate.

6. A liquid crystal display device according to claim 5, wherein said variations of positions of the peaks of depth distributions of concentration of the impurities are present under said gate insulating film.

7. A liquid crystal display device comprising a first substrate having a pixel electrode thereon and a thin film transistor coupled to said pixel electrode, a second substrate having a common electrode disposed thereon to face said pixel electrode, and a liquid crystal layer sealed between said first and second substrates,
said thin film transistor comprising:
a polycrystalline silicon semiconductor layer formed on said first substrate,
a gate electrode formed on said polycrystalline silicon semiconductor layer with a gate insulating film interposed therebetween,
an insulating film formed to cover said polycrystalline silicon semiconductor layer, said gate insulating film and said gate electrode,
a drain electrode formed on said insulating film and electrically connected to said polycrystalline silicon semiconductor layer, and
a source electrode formed on said insulating film, spaced from said drain electrode and electrically connected to said polycrystalline silicon semiconductor layer,
said polycrystalline silicon semiconductor layer being composed of a first polycrystalline silicon semiconductor film and a second polycrystalline silicon semiconductor film,
said first polycrystalline silicon semiconductor film being formed on said first substrate by laser annealing, having a thickness equal to or less than 50 nm, and having unevenness of a surface thereof within 10% of a thickness of said polycrystalline silicon semiconductor layer,
said second polycrystalline silicon semiconductor film being formed by depositing and then laser annealing an amorphous silicon semiconductor film of 50 nm or less in thickness on said first polycrystalline silicon semiconductor film, and a concentration of oxygen at an interface and its vicinities between said first and second polycrystalline silicon semiconductor films being equal to or less than $10^{19}$ atoms/cm$^3$.

8. A liquid crystal display device according to claim 7, wherein concentration of oxygen is measured under said gate insulating film.

9. A liquid crystal display device according to claim 7, wherein said gate insulating film is equal to or less than 80 nm.

10. A liquid crystal display device comprising a first substrate having a pixel electrode thereon and a thin film transistor coupled to said pixel electrode, a second substrate having a common electrode disposed thereon to face said pixel electrode, and a liquid crystal layer sealed between said first and second substrates, said thin film transistor comprising:
- a polycrystalline silicon semiconductor layer formed on said first substrate,
- a gate electrode formed on said polycrystalline silicon semiconductor layer with a gate insulating film interposed therebetween,
- an insulating film formed to cover said polycrystalline silicon semiconductor layer, said gate insulating film and said gate electrode,
- a drain electrode formed on said insulating film and electrically connected to said polycrystalline silicon semiconductor layer, and
- a source electrode formed on said insulating film, spaced from said drain electrode and electrically connected to said polycrystalline silicon semiconductor layer, said polycrystalline silicon semiconductor layer being composed of a first polycrystalline silicon semiconductor film and a second polycrystalline silicon semiconductor film, said first polycrystalline silicon semiconductor film being formed on said first substrate by laser annealing, having a thickness equal to or less than 50 nm, and having unevenness of a surface thereof within 10% of a thickness of said polycrystalline silicon semiconductor layer, said second polycrystalline silicon semiconductor film being formed by depositing and then laser annealing an amorphous silicon semiconductor film of 50 nm or less in thickness on said first polycrystalline silicon semiconductor film, and peaks of depth distribution of concentration of oxygen are not at an interface or its vicinities between said first and second polycrystalline silicon semiconductor films.

11. A liquid crystal display device provided with a pixel area on a substrate having a plurality of gate lines, a plurality of drain lines, a plurality of thin film transistors and a plurality of pixel electrodes corresponding to said plurality of thin film transistors, and a drive circuit area disposed at a periphery of said substrate and having a drive circuit for driving said plurality of thin film transistors, said thin film transistors comprising:
- a polycrystalline silicon semiconductor layer formed on said substrate,
- a gate electrode formed on said polycrystalline silicon semiconductor layer with a gate insulating film interposed therebetween,
- an insulating film formed to cover said polycrystalline silicon semiconductor layer, said gate insulating film and said gate electrode,
- a drain electrode formed on said insulating film and electrically connected to said polycrystalline silicon semiconductor layer, and
- a source electrode formed on said insulating film, spaced from said drain electrode and electrically connected to said polycrystalline silicon semiconductor layer, said polycrystalline silicon semiconductor layer being composed of a first polycrystalline silicon semiconductor film and a second polycrystalline silicon semiconductor film, said first polycrystalline silicon semiconductor film being formed on said substrate by laser annealing, having a thickness equal to or less than 50 nm, and having unevenness of a surface thereof within 10% of a thickness of said polycrystalline silicon semiconductor layer, said second polycrystalline silicon semiconductor film being formed on said first polycrystalline silicon semiconductor film by depositing and then laser annealing an amorphous silicon semiconductor film of 50 nm or less in thickness on said first polycrystalline silicon semiconductor film, and a concentration of nitrogen at an interface and its vicinities between said first and second polycrystalline silicon semiconductor films being equal to or less than $10^{19}$ atoms/cm$^3$.

12. A liquid crystal display device according to claim 11, wherein said concentration of nitrogen is present under said gate insulating film.

13. A liquid crystal display device according to claim 11, wherein said gate insulating film is equal to or less than 80 nm.

14. A liquid crystal display device provided with a pixel area on a substrate having a plurality of gate lines, a plurality of drain lines, a plurality of thin film transistors and a plurality of pixel electrodes corresponding to said plurality of thin film transistors, and a drive circuit area disposed at a periphery of said substrate and having a drive circuit for driving said plurality of thin film transistors, said thin film transistors comprising:
- a polycrystalline silicon semiconductor layer formed on said substrate,
- a gate electrode formed on said polycrystalline silicon semiconductor layer with a gate insulating film interposed therebetween,
- an insulating film formed to cover said polycrystalline silicon semiconductor layer, said gate insulating film and said gate electrode,
- a drain electrode formed on said insulating film and electrically connected to said polycrystalline silicon semiconductor layer and
- a source electrode formed on said insulating film, spaced from said drain electrode and electrically connected to said polycrystalline silicon semiconductor layer, said polycrystalline silicon semiconductor layer being composed of a first polycrystalline silicon semiconductor film and a second polycrystalline silicon semiconductor film, said first polycrystalline silicon semiconductor film being formed on said substrate by laser annealing, having a thickness equal to or less than 50 nm, and having unevenness of a surface thereof within 10% of a thickness of said polycrystalline silicon semiconductor layer, said second polycrystalline silicon semiconductor film being formed on said first polycrystalline silicon semiconductor film by depositing and then laser annealing an amorphous silicon semiconductor film of 50 nm or less in thickness on said first polycrystalline silicon semiconductor film, and peaks of depth distribution of concentration of nitrogen are not at an interface or its vicinities between said first and second polycrystalline silicon semiconductor films.

15. A method of fabricating a liquid crystal display device provided with a pixel area on a substrate having a plurality of gate lines, a plurality of drain lines, a plurality of thin film transistors and a plurality of pixel electrodes corresponding to said plurality of thin film transistors, and a drive circuit area disposed at a periphery of said substrate and having a drive circuit for driving said plurality of thin film transistors, said method comprising the steps of:

(a) forming a first amorphous silicon semiconductor film on said substrate and then converting said amorphous silicon semiconductor film into a first polycrystalline silicon semiconductor film by laser annealing, (b) cleaning a surface of said first polycrystalline silicon semiconductor film and thereby reducing an amount of an unintentional impurity on said surface of said first polycrystalline silicon semiconductor film to $10^{19}$ atoms/cm$^3$ or less, (c) forming a second amorphous silicon semiconductor film on said first polycrystalline silicon semiconductor film and then converting said second amorphous silicon semiconductor film into a second polycrystalline silicon semiconductor film using crystals in said first polycrystalline silicon semiconductor film as nucleuses by laser annealing and thereby merging said second polycrystalline silicon semiconductor film with said first polycrystalline silicon semiconductor film into a polycrystalline silicon semiconductor layer, (d) patterning said polycrystalline silicon semiconductor layer into a thin-film-transistor polycrystalline silicon semiconductor layer, (e) forming a gate insulating layer on said thin-film-transistor polycrystalline silicon semiconductor layer, (f) forming a first electrode material film on said gate insulating layer and then patterning said first electrode material film into a gate electrode, (g) introducing impurities for determining a conductivity type into regions of said thin-film-transistor polycrystalline silicon semiconductor layer corresponding to a source electrode and a drain electrode, respectively, (h) forming an interlayer insulating layer to cover said gate electrode, (i) opening semiconductor-layer contact holes by selectively removing regions of said gate insulating layer and said interlayer insulating layer corresponding to said regions of said thin-film-transistor polycrystalline silicon semiconductor layer corresponding to said source electrode and said drain electrode, respectively, (j) forming a second electrode material film to contact said regions of said thin-film-transistor polycrystalline silicon semiconductor layer corresponding to said source electrode and said drain electrode, respectively, via said semiconductor-layer contact holes and to cover said interlayer insulating layer, (k) patterning said second electrode material film into said source electrode and said drain electrode, (l) forming a protective film to cover said source electrode, said drain electrode and said interlayer insulating layer, (m) selectively removing said protective film to open a source-electrode contact hole extending to said source electrode, (n) forming a pixel-electrode material film to contact said source electrode through said source-electrode contact hole and cover said protective film, and (o) patterning said pixel-electrode material film into a pixel electrode.

16. A method of fabricating a liquid crystal display device according to claim 15, said method further comprising a following step (p) between said step (e) and said step (f): (p) introducing impurities into said thin-film-transistor polycrystalline silicon semiconductor layer to control a gate threshold voltage.

17. A method of fabricating a liquid crystal display device according to claim 15, wherein said unintentional impurity is oxygen.

18. A method of fabricating a liquid crystal display device according to claim 15, wherein said unintentional impurity is nitrogen.

19. A liquid crystal display device provided with a pixel area on a substrate having a plurality of gate lines, a plurality of drain lines, a plurality of thin film transistors and a plurality of pixel electrodes corresponding to said plurality of thin film transistors, and a drive circuit area disposed at a periphery of said substrate and having a drive circuit for driving said plurality of thin film transistors, said plurality of thin film transistors comprising:

a polycrystalline silicon semiconductor layer formed on said substrate, a gate electrode formed on said polycrystalline silicon semiconductor layer with a gate insulating film interposed therebetween, an insulating film to cover said polycrystalline silicon semiconductor layer, said gate insulating film and said gate electrode, a drain electrode formed on said insulating film and electrically connected to said polycrystalline silicon semiconductor layer, and a source electrode formed on said insulating film, spaced from said drain electrode and electrically connected to said polycrystalline silicon semiconductor layer, said polycrystalline silicon semiconductor layer being fabricated by initially forming a first amorphous silicon semiconductor film, then annealing and converting said first amorphous silicon semiconductor film into a first polycrystalline silicon layer, then cleaning a surface of said first polycrystalline silicon semiconductor layer, then forming a second amorphous silicon semiconductor film on said first polycrystalline silicon semiconductor layer, and then annealing said second amorphous silicon semiconductor film using an unmelted portion of said first amorphous silicon semiconductor film as nucleuses such that unevenness of a surface of said polycrystalline silicon semiconductor layer is within 10% of a thickness of said polycrystalline silicon semiconductor layer, and variations of positions of peaks of depth distributions of concentration of impurities introduced into said polycrystalline silicon semiconductor layer to determine a conductivity type thereof being within 10% of said thickness of said polycrystalline silicon semiconductor layer, said positions of said peaks being with respect to a surface of said substrate.

20. A liquid crystal display device according to claim 19, wherein said unevenness of said surface of said polycrystalline silicon semiconductor layer and said variations of positions of the peaks of depth distributions of concentration of the impurities are present under said gate insulating film.

21. A liquid crystal display device provided with a pixel area on a substrate having a plurality of gate lines, a plurality of drain lines, a plurality of thin film transistors and a plurality of pixel electrodes corresponding to said plurality of thin film transistors, and a drive circuit area disposed at a periphery of said substrate and having a drive circuit for driving said plurality of thin film transistors, said plurality of thin film transistors comprising:
    a polycrystalline silicon semiconductor layer formed on said substrate,
    a gate electrode formed on said polycrystalline silicon semiconductor layer with a gate insulating film interposed therebetween,
    an insulating film to cover said polycrystalline silicon semiconductor layer, said gate insulating film and said gate electrode, a drain electrode formed on said insulating film and electrically connected to said polycrystalline silicon semiconductor layer, and
    a source electrode formed on said insulating film, spaced from said drain electrode and electrically connected to said polycrystalline silicon semiconductor layer,
    said polycrystalline silicon semiconductor layer being fabricated by initially forming a first amorphous silicon semiconductor film, then annealing and converting said first amorphous silicon semiconductor film into a first polycrystalline silicon layer, then cleaning a surface of said first polycrystalline silicon semiconductor layer, then forming a second amorphous silicon semiconductor film on said first polycrystalline silicon semiconductor layer, and then annealing said second amorphous silicon semiconductor film using an unmelted portion of said first amorphous silicon semiconductor film as nucleuses such that unevenness of a surface of said polycrystalline silicon semiconductor layer is within 10% of a thickness of said polycrystalline silicon semiconductor layer.

22. A liquid crystal display device according to claim 21, wherein said unevenness of said surface of said polycrystalline silicon semiconductor layer is present under said gate insulating film.

* * * * *